United States Patent
Liu et al.

(10) Patent No.: US 11,710,435 B2
(45) Date of Patent: Jul. 25, 2023

(54) SHIFT REGISTER UNIT AND DRIVING METHOD THEREOF, GATE DRIVING CIRCUIT, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Xingyi Liu, Beijing (CN); Yongxian Xie, Beijing (CN); Jideng Zhou, Beijing (CN); Fengzhen Lv, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 554 days.

(21) Appl. No.: 16/965,559

(22) PCT Filed: Oct. 18, 2019

(86) PCT No.: PCT/CN2019/111969
§ 371 (c)(1),
(2) Date: Jul. 28, 2020

(87) PCT Pub. No.: WO2021/072750
PCT Pub. Date: Apr. 22, 2021

(65) Prior Publication Data
US 2023/0162637 A1 May 25, 2023

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2300/0408* (2013.01);
(Continued)

(58) Field of Classification Search
None
See application file for complete search history.

(56) References Cited

U.S. PATENT DOCUMENTS

2006/0145999 A1  7/2006  Cho et al.
2017/0270851 A1* 9/2017  Shang .................. G09G 3/2092

FOREIGN PATENT DOCUMENTS

CN  101335050 A  12/2008
CN  103559868 A   2/2014
(Continued)

*Primary Examiner* — Xuemei Zheng
(74) *Attorney, Agent, or Firm* — Banner & Witcoff, Ltd.

(57) ABSTRACT

A shift register unit and a driving method thereof, a gate driving circuit, and a display device are provided. In the shift register unit, the input circuit inputs an input signal to a first node; the output circuit outputs an output signal to an output terminal; the first control circuit performs a first control on a level of a first control node; the first noise reduction control circuit controls a level of a second node; the second control circuit performs a second control on a level of a second control node; the second noise reduction control circuit controls a level of a third node; the first voltage-stabilizing circuit performs a third control on the level of the second control node, and the second control and the third control cause at least part of the second noise reduction control circuit to be in different bias states.

20 Claims, 14 Drawing Sheets

(52) U.S. Cl.
CPC ............... *G09G 2310/0267* (2013.01); *G09G 2310/0286* (2013.01); *G09G 2320/045* (2013.01)

(56) References Cited

FOREIGN PATENT DOCUMENTS

| | | | |
|---|---|---|---|
| CN | 103778896 A | 5/2014 | |
| CN | 104134416 A | 11/2014 | |
| CN | 104700814 A | 6/2015 | |
| CN | 105206243 A | 12/2015 | |
| CN | 105304057 A * | 2/2016 | ............... G09G 1/02 |
| CN | 105913826 A | 8/2016 | |
| CN | 108831403 A | 11/2018 | |
| CN | 109448656 A | 3/2019 | |
| CN | 110246447 A | 9/2019 | |
| KR | 20060078570 A | 7/2006 | |

\* cited by examiner

SHIFT REGISTER UNIT AND DRIVING METHOD THEREOF, GATE DRIVING CIRCUIT, AND DISPLAY DEVICE

This application is a U.S. National Phase Entry of International Application No. PCT/CN2019/111969 filed on Oct. 18, 2019, designating the United States of America. The present application claims priority to and the benefit of the above-identified application and the above-identified application is incorporated by reference herein in its entirety.

TECHNICAL FIELD

The embodiments of the present disclosure relate to a shift register unit and a driving method thereof, a gate driving circuit, and a display device.

BACKGROUND

In a field of display technology, for example, a pixel array of a liquid crystal display usually includes a plurality of rows of gate lines and a plurality of columns of data lines, which are interleaved with the plurality of rows of gate lines. The driving of the gate line can be achieved by the attached integrated driving circuit. In recent years, with the continuous improvement of amorphous silicon thin film technology, the gate driving circuit can also be directly integrated on the thin film transistor array substrate to form a GOA (Gate driver On Array) to drive the gate line.

For example, a GOA composed of a plurality of cascaded shift register units can be used to provide on/off state voltage signals for the plurality of rows of gate lines of the pixel array, so as to control the plurality of rows of gate lines to be turned on sequentially, and the data lines provide data signals to the pixel units of the corresponding rows in the pixel array to form the gray voltages required for the respective gray levels for displaying an image, thereby displaying each frame of image.

SUMMARY

At least one embodiment of the present disclosure provides a shift register unit comprising an input circuit, an output circuit, a first control circuit, a first noise reduction control circuit, a second control circuit, a second noise reduction control circuit, and a first voltage-stabilizing circuit, wherein the input circuit is connected to a first node, and is configured to input an input signal to the first node in response to an input control signal; the output circuit is connected to the first node and an output terminal, and is configured to output an output signal to the output terminal under control of a level of the first node; the first control circuit is connected to the first node and a first control node, and is configured to perform a first control on a level of the first control node under the control of the level of the first node; the first noise reduction control circuit is connected to the first node, the first control node, and a second node, and is configured to control a level of the second node under control of the level of the first node and the level of the first control node; the second control circuit is connected to the first node and a second control node, and is configured to perform a second control on a level of the second control node under the control of the level of the first node; the second noise reduction control circuit is connected to the first node, the second control node, and a third node, and is configured to control a level of the third node under control of the level of the first node and the level of the second control node; and the first voltage-stabilizing circuit is connected to the second control node, and is configured to perform a third control on the level of the second control node in response to a first voltage-stabilizing signal, and the second control and the third control cause at least part of the second noise reduction control circuit to be in different bias states.

For example, in the shift register unit provided by an embodiment of the present disclosure, the first voltage-stabilizing circuit is further connected to the second node, and a voltage of the second node is used as the first voltage-stabilizing signal.

For example, the shift register unit provided by an embodiment of the present disclosure further comprises a second voltage-stabilizing circuit, the second voltage-stabilizing circuit is connected to the first control node, and is configured to perform a fourth control on the level of the first control node in response to a second voltage-stabilizing signal, and the first control and the fourth control cause at least part of the first noise reduction control circuit to be in different bias states.

For example, in the shift register unit provided by an embodiment of the present disclosure, the second voltage-stabilizing circuit is further connected to the third node, and a voltage of the third node is used as the second voltage-stabilizing signal.

For example, in a shift register unit provided by an embodiment of the present disclosure, the first voltage-stabilizing circuit comprises a first transistor, a gate electrode of the first transistor is configured to receive the first voltage-stabilizing signal, a first electrode of the first transistor is connected to the second control node, and a second electrode of the first transistor is connected to a first voltage-stabilizing terminal to receive a first voltage-stabilizing voltage.

For example, in the shift register unit provided by an embodiment of the present disclosure, the second voltage-stabilizing circuit comprises a second transistor, a gate electrode of the second transistor is configured to receive the second voltage-stabilizing signal, a first electrode of the second transistor is connected to the first control node, and a second electrode of the second transistor is connected to a second voltage-stabilizing terminal to receive a second voltage-stabilizing voltage.

For example, in the shift register unit provided by an embodiment of the present disclosure, the first noise reduction control circuit comprises a third transistor and a fourth transistor, a gate electrode of the third transistor is connected to the first node, a first electrode of the third transistor is connected to the second node, and a second electrode of the third transistor is connected to a first voltage terminal to receive a first voltage; a gate electrode of the fourth transistor is connected to the first control node, a first electrode of the fourth transistor is connected to a second voltage terminal to receive a second voltage, and a second electrode of the fourth transistor is connected to the second node; and the first control and the fourth control cause the fourth transistor to be in different bias states.

For example, in the shift register unit provided by an embodiment of the present disclosure, the second noise reduction control circuit comprises a fifth transistor and a sixth transistor, a gate electrode of the fifth transistor is connected to the first node, a first electrode of the fifth transistor is connected to the third node, and a second electrode of the fifth transistor is connected to a first voltage terminal to receive a first voltage; a gate electrode of the sixth transistor is connected to the second control node, a first electrode of the sixth transistor is connected to a third voltage terminal to receive a third voltage, and a second electrode of the sixth transistor is connected to the third node; and the second control and the third control cause the sixth transistor to be in different bias states.

For example, in the shift register unit provided by an embodiment of the present disclosure, the first control circuit comprises a seventh transistor and an eighth transistor, and the second control circuit comprises a ninth transistor and a tenth transistor, a gate electrode of the seventh transistor is connected to the first node, a first electrode of the seventh transistor is connected to the first control node, and a second electrode of the seventh transistor is connected to a first voltage terminal to receive a first voltage; a gate electrode of the eighth transistor is connected to a second voltage terminal to receive a second voltage, a first electrode of the eighth transistor is connected to the second voltage terminal to receive the second voltage, and a second electrode of the eighth transistor is connected to the first control node; a gate electrode of the ninth transistor is connected to the first node, a first electrode of the ninth transistor is connected to the second control node, and a second electrode of the ninth transistor is connected to the first voltage terminal to receive the first voltage; and a gate electrode of the tenth transistor is connected to a third voltage terminal to receive a third voltage, a first electrode of the tenth transistor is connected to the third voltage terminal to receive the third voltage, and a second electrode of the tenth transistor is connected to the second control node.

For example, in the shift register unit provided by an embodiment of the present disclosure, the input circuit comprises an eleventh transistor, a gate electrode of the eleventh transistor is configured to receive the input control signal, a first electrode of the eleventh transistor is connected to an input signal terminal to receive the input signal, and a second electrode of the eleventh transistor is connected to the first node.

For example, in the shift register unit provided by an embodiment of the present disclosure, the output circuit comprises a first sub-output circuit and a second sub-output circuit, the output terminal comprises a shift signal output terminal and a scan signal output terminal, and the output signal comprises a first sub-output signal and a second sub-output signal, the first sub-output circuit is connected to the first node and the shift signal output terminal, and is configured to output the first sub-output signal to the shift signal output terminal under the control of the level of the first node; and the second sub-output circuit is connected to the first node and the scan signal output terminal, and is configured to output the second sub-output signal to the scan signal output terminal under the control of the level of the first node.

For example, in the shift register unit provided by an embodiment of the present disclosure, the first sub-output circuit comprises a twelfth transistor and a storage capacitor, a gate electrode of the twelfth transistor is connected to the first node, a first electrode of the twelfth transistor is connected to a clock signal terminal to receive a clock signal, and a second electrode of the twelfth transistor is connected to the shift signal output terminal to output the clock signal to the shift signal output terminal as the first sub-output signal; a first electrode of the storage capacitor is connected to the gate electrode of the twelfth transistor, and a second electrode of the storage capacitor is connected to the second electrode of the twelfth transistor; and the second sub-output circuit comprises a thirteenth transistor, a gate electrode of the thirteenth transistor is connected to the first node, a first electrode of the thirteenth transistor is connected to the clock signal terminal to receive the clock signal, and a second electrode of the thirteenth transistor is connected to the scan signal output terminal to output the clock signal to the scan signal output terminal as the second sub-output signal.

For example, the shift register unit provided by an embodiment of the present disclosure further comprises a first reset circuit, a second reset circuit, a node noise reduction circuit, a first output noise reduction circuit, and a second output noise reduction circuit, the first reset circuit is connected to the first node, and is configured to reset the first node in response to a first reset signal; the second reset circuit is connected to the first node, and is configured to reset the first node in response to a frame reset signal; the node noise reduction circuit is connected to the first node, the second node, and the third node, and is configured to perform noise reduction on the first node under control of the level of the second node and the level of the third node; the first output noise reduction circuit is connected to the shift signal output terminal, the second node, and the third node, and is configured to perform noise reduction on the shift signal output terminal under the control of the level of the second node and the level of the third node; and the second output noise reduction circuit is connected to the scan signal output terminal, the second node, and the third node, and is configured to perform noise reduction on the scan signal output terminal under the control of the level of the second node and the level of the third node.

For example, in the shift register unit provided by an embodiment of the present disclosure, the first reset circuit comprises a fourteenth transistor, a gate electrode of the fourteenth transistor is connected to a first reset signal terminal to receive the first reset signal, a first electrode of the fourteenth transistor is connected to the first node, and a second electrode of the fourteenth transistor is connected to a first voltage terminal to receive a first voltage; and the second reset circuit comprises a fifteenth transistor, a gate electrode of the fifteenth transistor is connected to a frame reset signal terminal to receive the frame reset signal, a first electrode of the fifteenth transistor is connected to the first node, and a second electrode of the fifteenth transistor is connected to the first voltage terminal to receive the first voltage; the node noise reduction circuit comprises a sixteenth transistor and a seventeenth transistor, a gate electrode of the sixteenth transistor is connected to the second node, a first electrode of the sixteenth transistor is connected to the first node, and a second electrode of the sixteenth transistor is connected to the first voltage terminal to receive the first voltage; a gate electrode of the seventeenth transistor is connected to the third node, a first electrode of the seventeenth transistor is connected to the first node, and a second electrode of the seventeenth transistor is connected to the first voltage terminal to receive the first voltage; the first output noise reduction circuit comprises an eighteenth transistor and a nineteenth transistor, a gate electrode of the eighteenth transistor is connected to the second node, a first electrode of the eighteenth transistor is connected to the shift signal output terminal, and a second electrode of the eighteenth transistor is connected to the first voltage terminal to receive the first voltage; a gate electrode of the nineteenth transistor is connected to the third node, a first electrode of the nineteenth transistor is connected to the shift signal output terminal, and a second electrode of the nineteenth transistor is connected to the first voltage terminal to receive the first voltage; and the second output noise reduction circuit comprises a twentieth transistor and a twenty-first transistor, a gate electrode of the twentieth transistor is connected to the second node, a first electrode of the twentieth transistor is connected to the scan signal output terminal, and a second electrode of the twentieth transistor is connected to the first voltage terminal to receive the first voltage; a gate electrode of the twenty-first transistor is connected to the third node, a first electrode of the twenty-first transistor is connected to the scan signal output terminal, and a second electrode of the twenty-first transistor is connected to the first voltage terminal to receive the first voltage.

At least one embodiment of the present disclosure further provides a gate driving circuit comprising a plurality of shift register units, which are cascaded, according to any of the above embodiments.

At least one embodiment of the present disclosure also provides a display device comprising the gate driving circuit according to any of the above embodiments.

At least one embodiment of the present disclosure also provides a driving method for driving the shift register unit according to any of the above embodiments. The driving method comprises: in an input stage, in response to the input control signal, inputting the input signal to the first node through the input circuit; in an output stage, under the control of the level of the first node, outputting the output signal to the output terminal through the output circuit; in a first control stage, under the control of the level of the first node, performing the first control on the level of the first control node through the first control circuit; in a first noise reduction control stage, under control of the level of the first node and the level of the first control node, controlling the level of the second node through the first noise reduction control circuit; in a second control stage, under the control of the level of the first node, performing the second control on the level of the second control node through the second control circuit; in a second noise reduction control stage, under control of the level of the first node and the level of the second control node, controlling the level of the third node through the second noise reduction control circuit; in a first voltage stabilization stage, in response to the first voltage-stabilizing signal, performing the third control on the level of the second control node through the first voltage-stabilizing circuit; wherein the second control and the third control cause the at least part of the second noise reduction control circuit to be in different bias states.

For example, in the driving method provided by an embodiment of the present disclosure, the second control circuit is configured to be connected to a first voltage terminal to receive a first voltage, the first voltage-stabilizing circuit is configured to be connected to a first voltage-stabilizing terminal to receive a first voltage-stabilizing voltage, the first voltage-stabilizing voltage comprises a first sub-voltage and a second sub-voltage, the first sub-voltage is in the input stage and the output stage, the second sub-voltage is in the first voltage stabilization stage, a level of the first sub-voltage is equal to a level of the first voltage, and a level of the second sub-voltage is less than the level of the first voltage; in the first voltage stabilization stage, in response to the first voltage-stabilizing signal, performing the third control on the level of the second control node through the first voltage-stabilizing circuit comprises: in response to the first voltage-stabilizing signal, the first voltage-stabilizing circuit being turned on to write the second sub-voltage to the second control node to perform the third control on the second control node.

For example, in the driving method provided by an embodiment of the present disclosure, in a case where the shift register unit comprises a second voltage-stabilizing circuit, the driving method further comprises: in a second voltage stabilization stage, in response to a second voltage-stabilizing signal, performing a fourth control on the level of the first control node through the second voltage-stabilizing circuit; wherein the first control and the fourth control cause at least part of the first noise reduction control circuit to be in different bias states.

For example, in the driving method provided by an embodiment of the present disclosure, the first control circuit is configured to be connected to a first voltage terminal to receive a first voltage, the second voltage-stabilizing circuit is configured to be connected to a second voltage-stabilizing terminal to receive a second voltage-stabilizing voltage, the second voltage-stabilizing voltage comprises a third sub-voltage and a fourth sub-voltage, the third sub-voltage is in the input stage and the output stage, the fourth sub-voltage is in the second voltage stabilization stage, a level of the third sub-voltage is equal to a level of the first voltage, and a level of the fourth sub-voltage is less than the level of the first voltage; in the second voltage stabilization stage, in response to a second voltage-stabilizing signal, performing a fourth control on the level of the first control node through the second voltage-stabilizing circuit comprises: in response to the second voltage-stabilizing signal, the second voltage-stabilizing circuit being turned on to write the fourth sub-voltage to the first control node to perform the fourth control on the first control node.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
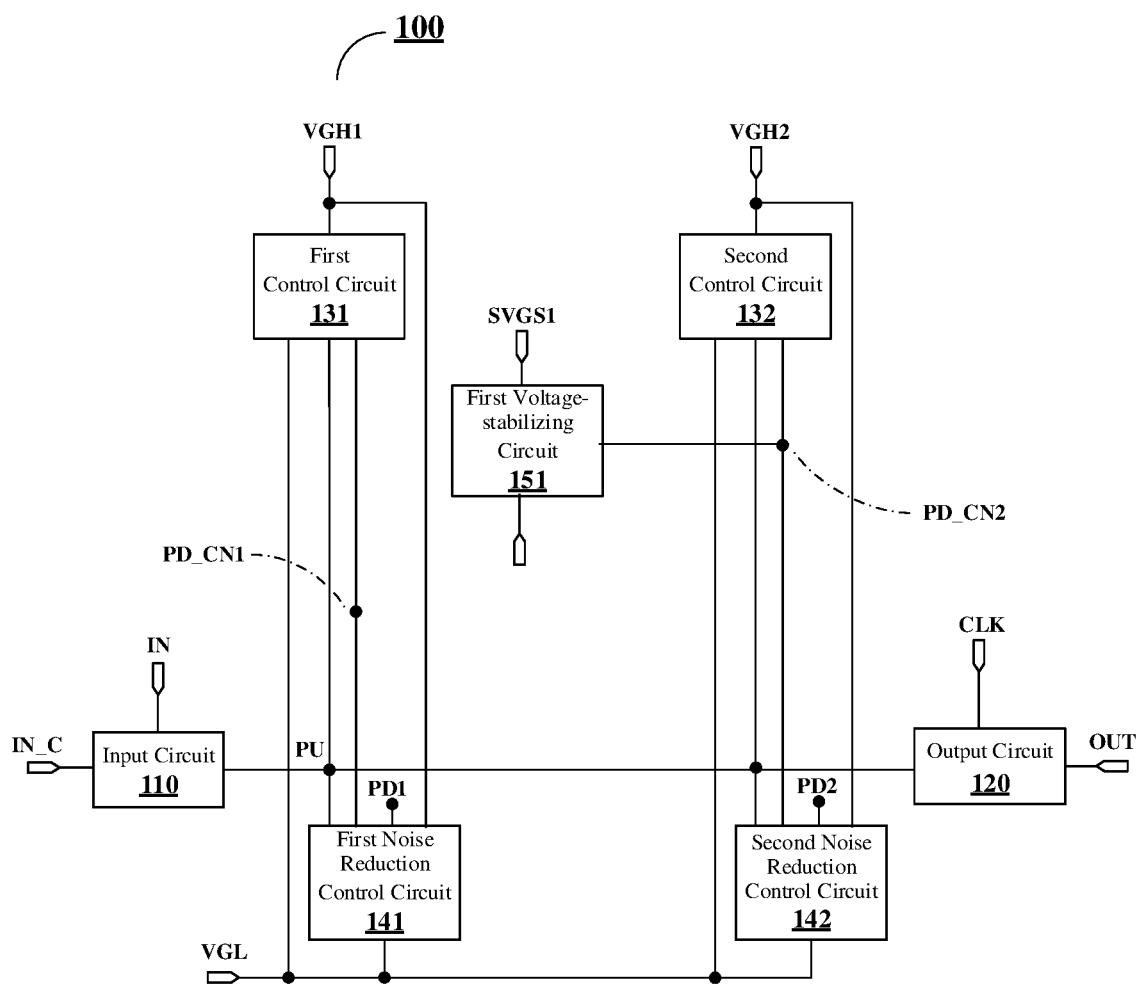
FIG. 1A is a schematic block diagram of a shift register unit provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In display panel technology, in order to achieve low cost and narrow frame, a GOA (Gate driver On Array) technology can be adopted, i.e., a technology in which the gate driving circuit is integrated on the display panel through a thin film transistor process, thereby achieving advantages such as narrow frame and lower assembly cost. However, as the operating time of the gate driving circuit increases, the threshold voltage of the transistor that has been controlled by the forward voltage for a long time will have a drift (e.g., a positive drift), that is, the threshold voltage of the N-type transistor will gradually increase, the threshold voltage of the P-type transistor will gradually decrease, and the drift of the threshold voltage of the transistor will hinder the normal conduction of the transistor, so that the level of the corresponding node cannot be pulled up or down in time, which will affect the working performance of the gate driving circuit.

At least one embodiment of the present disclosure provides a shift register unit. The shift register unit includes an input circuit, an output circuit, a first control circuit, a first noise reduction control circuit, a second control circuit, a second noise reduction control circuit, and a first voltage-stabilizing circuit. The input circuit is connected to a first node, and is configured to write an input signal to the first node in response to an input control signal; the output circuit is connected to the first node and an output terminal, and is configured to output an output signal to the output terminal under the control of the level of the first node; the first control circuit is connected to the first node and a first control node, and is configured to perform a first control on the level of the first control node under the control of the level of the first node; the first noise reduction control circuit is connected to the first node, the first control node, and a second node, and is configured to control the level of the second node under the control of the level of the first node and the level of the first control node; the second control circuit is connected to the first node and a second control node, and is configured to perform a second control on the level of the second control node under the control of the level of the first node; the second noise reduction control circuit is connected to the first node, the second control node, and a third node, and is configured to control the level of the third node under the control of the level of the first node and the level of the second control node; and the voltage-stabilizing circuit is connected to the second control node, and is configured to perform a third control on the level of the second control node in response to a first voltage-stabilizing signal. The second control and the third control cause at least part of the second noise reduction control circuit to be in different bias states.

The shift register unit provided by the embodiment of the present disclosure can make at least part of the first noise reduction control circuit be in a constantly changing bias state through the first voltage-stabilizing circuit, so as to stabilize the threshold voltage of at least part of the first noise reduction control circuit, thereby eliminating the influence of the threshold voltage drift of the transistor on the operating performance of the gate driving circuit.

It should be noted that, in the embodiments of the present disclosure, for example, in a case where each circuit is implemented as N-type transistors, the term "pull-up" means to charge a node or an electrode of a transistor to increase the absolute value of the level of the node or the electrode, so as to achieve the operation (for example, turning on) of the corresponding transistor; and the term "pull down" means to discharge a node or an electrode of a transistor to reduce the absolute value of the level of the node or the electrode, so as to achieve the operation (for example, turning off) of the corresponding transistor. The term "working potential" means that the node is at a high potential, so that in a case where a gate electrode of a transistor is connected to this node, the transistor is turned on; and the term "non-working potential" means that the node is at a low potential, so that in a case where a gate electrode of a transistor is connected to this node, the transistor is turned off. For another example, in a case where each circuit is implemented as P-type transistors, the term "pull-up" means to discharge a node or an electrode of a transistor to reduce the absolute value of the level of the node or the electrode, so as to achieve the operation (for example, turning on) of the corresponding transistor; the term "pull-down" means to charge a node or an electrode of a transistor to increase the absolute value of the level of the node or the electrode, so as to achieve the operation (for example, turning off) of the corresponding transistor. The term "working potential" means that the node is at a low potential, so that in a case where a gate electrode of a transistor is connected to this node, the transistor is turned on; and the term "non-working potential" means that the node is at a high potential, so that in a case where a gate electrode of a transistor is connected to this node, the transistor is turned off.

The embodiments of the present disclosure will be described in detail below with reference to the drawings, but the present disclosure is not limited to these specific embodiments.

Figure 1B:
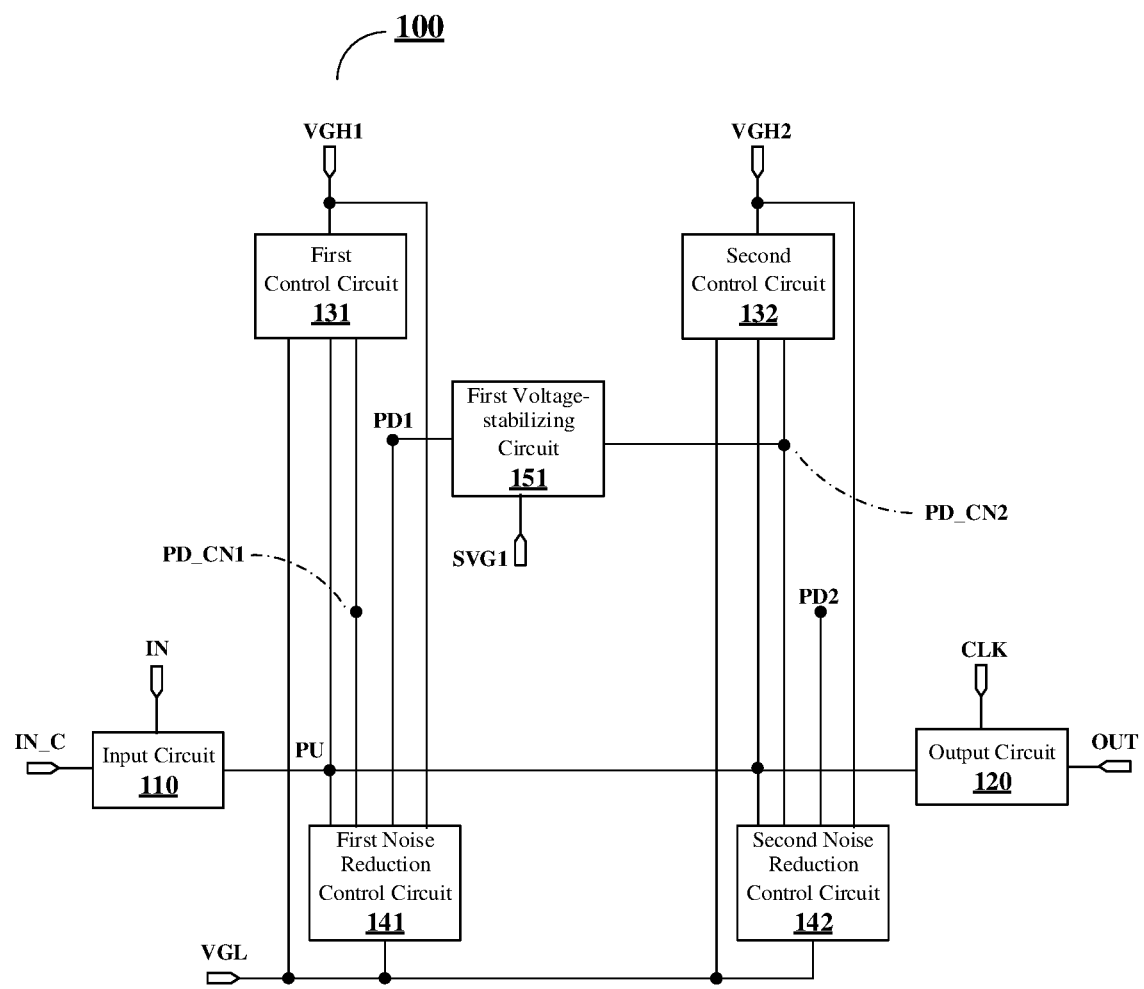
FIG. 1B is a schematic block diagram of another shift register unit provided by an embodiment of the present disclosure.
Figure 1C:
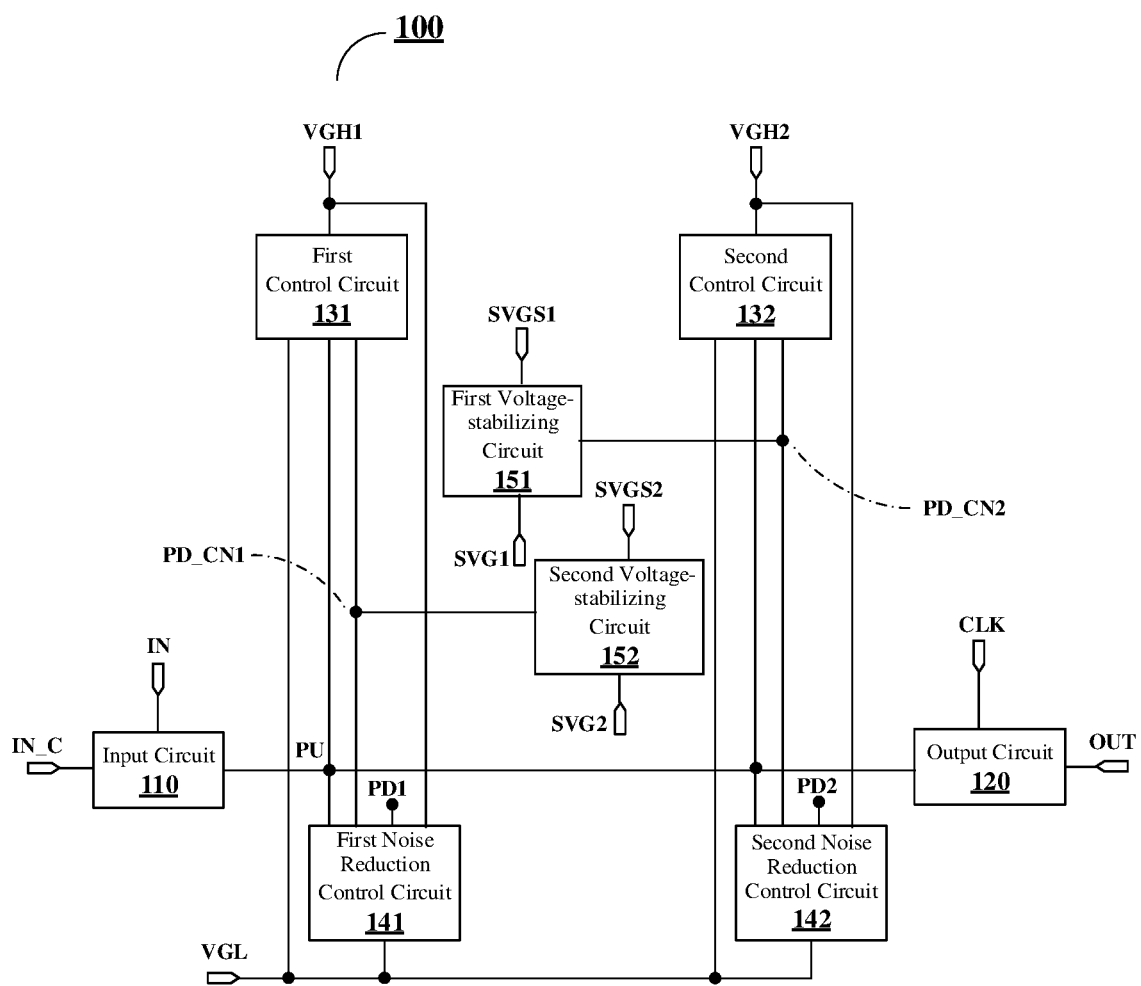
FIG. 1C is a schematic block diagram of yet another shift register unit provided by an embodiment of the present disclosure.
Figure 1D:
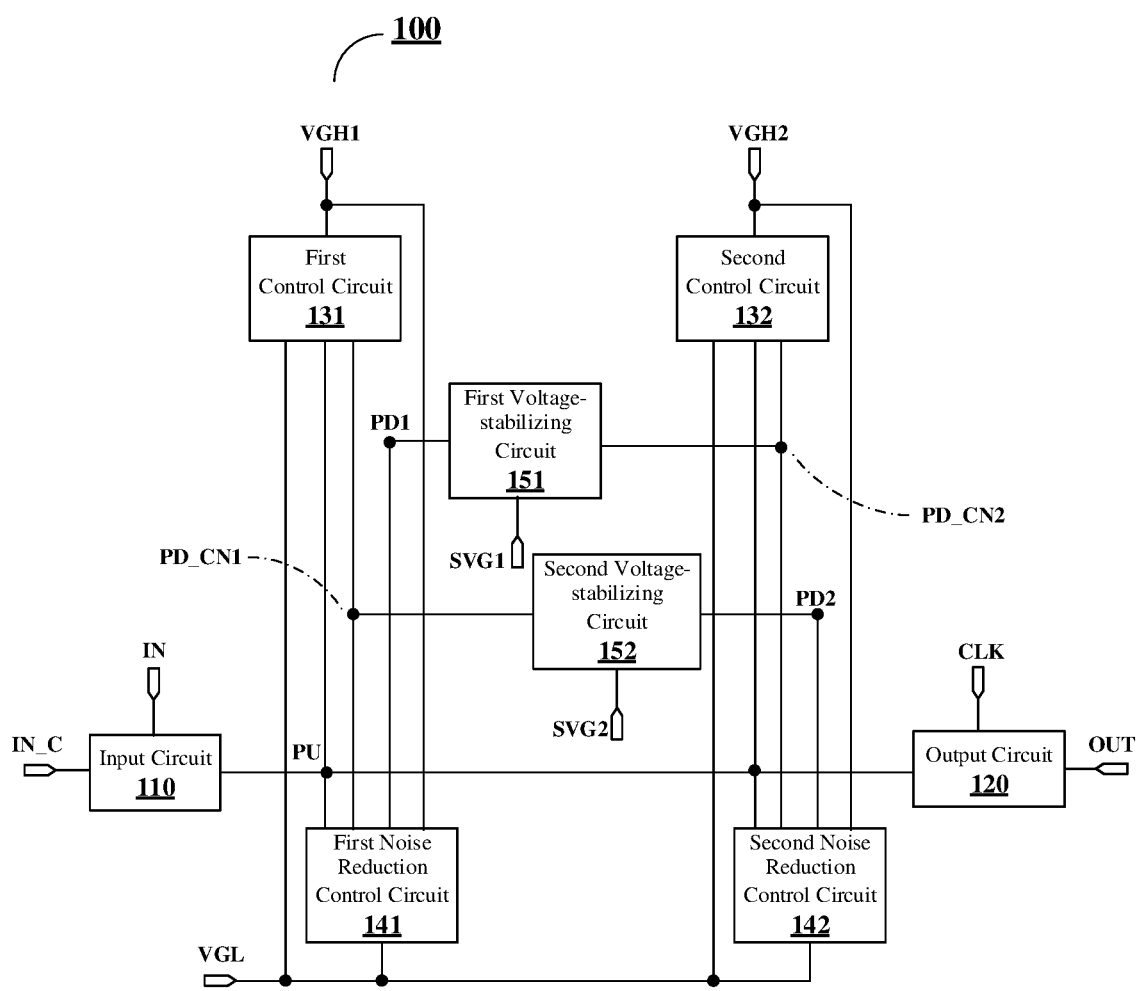
FIG. 1D is a schematic block diagram of still another shift register unit provided by an embodiment of the present disclosure.

FIG. 1A is a block diagram of a shift register unit according to an embodiment of the present disclosure. FIG. 1B is a block diagram of another shift register unit provided by an embodiment of the present disclosure. FIG. 1C is a block diagram of yet another shift register unit provided by an embodiment of the present disclosure. FIG. 1D is a block diagram of yet another shift register unit provided by an embodiment of the present disclosure.

As shown in FIGS. 1A and 1B, a shift register unit 100 includes an input circuit 110, an output circuit 120, a first control circuit 131, a first noise reduction control circuit 141, a second control circuit 132, a second noise reduction control circuit 142, and a first voltage-stabilizing circuit 151. As shown in FIGS. 1C and 1D, the shift register unit 100 further includes a second voltage-stabilizing circuit 152.

For example, the shift register unit provided by the embodiment of the present disclosure may also make at least part of the second noise reduction control circuit be in a constantly changing bias state through the second voltage-stabilizing circuit, so as to stabilize the threshold voltage of at least part of the second noise reduction control circuit, thereby eliminating the influence of the threshold voltage drift of the transistor on the operating performance of the gate driving circuit.

It should be noted that, in the embodiments of the present disclosure, the first control circuit and the first noise reduction control circuit may be in a complementary working state with the second control circuit and the second noise reduction control circuit, that is, in a case where the first control circuit and the first noise reduction control circuit are in a working state, the second control circuit and the second noise reduction control circuit may be in an idle state, and in a case where the first control circuit and the first noise reduction control circuit are in the idle state, the second control circuit and the second noise reduction control circuit may be in a working state. The first voltage-stabilizing circuit may also be in a complementary working state with the second voltage-stabilizing circuit, that is, in a case where the first voltage-stabilizing circuit is in the working state, the second voltage-stabilizing circuit may be in the idle state, and in a case where the first voltage-stabilizing circuit is in the idle state, the second voltage-stabilizing circuit may be in the working state. The following embodiments of the present disclosure are the same as those described herein, and similar portions will not be described again. However, the present disclosure is not limited to this aspect, and the first control circuit, the first noise reduction control circuit, the second control circuit, and the second noise reduction control circuit may also be simultaneously in the working state at certain times. The first voltage-stabilizing circuit and the second voltage-stabilizing circuit may also be simultaneously in the working state.

In addition, it should be noted that, in the embodiments of the present disclosure, in a case where the first control circuit and the first noise reduction control circuit are in the working state and the second control circuit and the second noise reduction control circuit are in the idle state, the first voltage-stabilizing circuit is in the working state and the second voltage-stabilizing circuit is in the idle state, and in a case where the first control circuit and the first noise reduction control circuit are in the idle state and the second control circuit and the second noise reduction control circuit are in the working state, the first voltage-stabilizing circuit is in the idle state and the second voltage-stabilizing circuit is in the working state. The following embodiments of the present disclosure are the same as those described herein, and similar portions will not be described again.

The input circuit 110 is configured to input an input signal to a first node PU in response to an input control signal. For example, as shown in FIGS. 1A, 1B, 1C, and 1D, the input circuit 110 is connected to an input signal terminal IN, an input control signal terminal IN_C, and the first node PU (referred to herein as a pull-up node). In a case where the input circuit 110 is turned on in response to the input control signal provided by the input control signal terminal IN_C, the input signal terminal IN is connected to the first node PU, so that the input signal provided by the input signal terminal IN is input to the first node PU, thereby pulling up the level of the first node PU to a working potential, such as a high level.

The output circuit 120 is configured to output an output signal to an output terminal OUT under the control of the level of the first node PU. For example, as shown in FIGS. 1A, 1B, 1C, and 1D, the output circuit 120 may be connected to the first node PU, a clock signal terminal CLK, and the output terminal OUT. In a case where the output circuit 120 is turned on under the control of the level of the first node PU, the clock signal terminal CLK is connected to the output terminal OUT, so that a clock signal provided by the clock signal terminal CLK is output to the output terminal OUT.

The first control circuit 131 is configured to perform a first control on a level of a first control node PD_CN1 under the control of the level of the first node PU. For example, as shown in FIGS. 1A, 1B, 1C, and 1D, the first control circuit 131 may be connected to a first voltage terminal VGL, a second voltage terminal VGH1, the first node PU, and the first control node PD_CN1. In a case where the first node PU is at a high level, the first control circuit 131 is configured to connect the first control node PD_CN1 to the first voltage terminal VGL and disconnect the first control node PD_CN1 from the second voltage terminal VGH1, thereby pulling down the voltage of the first control node PD_CN1 to a first voltage output by the first voltage terminal VGL, that is, pulling down the level of the first control node PD_CN1 to the low level of the first voltage; and in a case where the first node PU is at a low level, the first control circuit 131 is configured to disconnect the first control node PD_CN1 from the first voltage terminal VGL and connect the first control node PD_CN1 to the second voltage terminal VGH1, thereby pulling up the voltage of the first control node PD_CN1 to a second voltage output by the second voltage terminal VGH1, that is, pulling up the level of the first control node PD_CN1 to the high level of the second voltage. The first control may include pulling down the level of the first control node PD_CN1 to the low level of the first voltage and pulling up the level of the first control node PD_CN1 to the high level of the second voltage.

The first noise reduction control circuit 141 is configured to control a level of a second node PD1 (referred to herein as a first pull-down node) under the control of the level of the first node PU and the level of the first control node PD_CN1. For example, as shown in FIGS. 1A, 1B, 1C and 1D, the first noise reduction control circuit 141 may be connected to the first voltage terminal VGL, the second voltage terminal VGH1, the first node PU, the second node PD1, and the first control node PD_CN1. In a case where the first node PU is at a high level, the first noise reduction control circuit 141 is configured to connect the second node PD1 to the first voltage terminal VGL, thereby pulling down the level of the second node PD1 to the low level of the first voltage; and in a case where the first node PU is at a low level and the first control node PD_CN1 is at a high level, the first noise reduction control circuit 141 is configured to disconnect the second node PD1 from the first voltage terminal VGL and connect the second node PD1 to the second voltage terminal VGH1, thereby pulling up the level of the second node PD1 to the high level of the second voltage.

The second control circuit 132 is configured to perform a second control on a level of a second control node PD_CN2 under the control of the level of the first node PU. For example, as shown in FIGS. 1A, 1B, 1C, and 1D, the second control circuit 132 may be connected to the first voltage terminal VGL, a third voltage terminal VGH2, the first node PU, and the second control node PD_CN2. In a case where the first node PU is at a high level, the second control circuit 132 is configured to connect the second control node PD_CN2 to the first voltage terminal VGL, thereby pulling down the level of the second control node PD_CN2 to the low level of the first voltage; and in a case where the first node PU is at a low level, the second control circuit 132 is configured to disconnect the second control node PD_CN2 from the first voltage terminal VGL and connect the second control node PD_CN2 to a third voltage terminal VGH2, thereby pulling up the voltage of the second control node PD_CN2 to a third voltage output by the third voltage terminal VGH2, that is, pulling up the level of the second control node PD_CN2 to the high level of the third voltage. The second control may include pulling down the level of the second control node PD_CN2 to the low level of the first voltage and pulling up the level of the second control node PD_CN2 to the high level of the third voltage.

For example, the high level of the second voltage may be the same as the high level of the third voltage.

The second noise reduction control circuit 142 is configured to control a level of a third node PD2 (referred to herein as a second pull-down node) under the control of the level of the first node PU and the level of the second control node PD_CN2. For example, as shown in FIGS. 1A, 1B, 1C and 1D, the second noise reduction control circuit 142 may be connected to the first voltage terminal VGL, the third voltage terminal VGH2, the first node PU, the third node PD2, and the second control node PD_CN2. In a case where the first node PU is at a high level, the second noise reduction control circuit 142 is configured to connect the third node PD2 to the first voltage terminal VGL, thereby pulling down the level of the third node PD2 to the low level of the first voltage; and in a case where the first node PU is at a low level and the second control node PD_CN1 is at a high level, the second noise reduction control circuit 142 is configured to disconnect the third node PD2 from the first voltage terminal VGL and connect the third node PD2 to the third voltage terminal VGH2, thereby pulling up the level of the third node PD2 to the high level of the third voltage.

The first voltage-stabilizing circuit 151 is configured to perform a third control on the level of the second control node PD_CN2 in response to a first voltage-stabilizing signal, and the second control and the third control cause at least part of the second noise reduction control circuit 142 to be in different bias states. For example, as shown in FIG. 1A, in some embodiments, the first voltage-stabilizing circuit 151 may be connected to a first voltage-stabilizing terminal SVG1, a first voltage-stabilizing signal terminal SVGS1, and the second control node PD_CN2. In a case where the first voltage-stabilizing circuit 151 is turned on in response to the first voltage-stabilizing signal provided by the first voltage-stabilizing signal terminal SVGS1, the second control node PD_CN2 is connected to the first voltage-stabilizing terminal SVG1, thereby pulling down the voltage of the second control node PD_CN2 to a first voltage-stabilizing voltage output by the voltage-stabilizing terminal SVG1, that is, pulling down the level of the second control node PD_CN2 to the level of the first voltage-stabilizing voltage. In addition, as shown in FIG. 1B, in other embodiments, the first voltage-stabilizing circuit 151 may be connected to the first voltage-stabilizing terminal SVG1, the second node PD1, and the second control node PD_CN2, and takes the voltage of the second node PD1 as the first voltage-stabilizing signal. In a case where the first voltage-stabilizing circuit 151 is turned on in response to the voltage of the second node PD1, the second control node PD_CN2 is connected to the first voltage-stabilizing terminal SVG1, thereby pulling down the level of the second control node PD_CN2 to the level of the first voltage-stabilizing voltage. The third control may include pulling down the level of the second control node PD_CN2 to the level of the first voltage-stabilizing voltage.

The second voltage-stabilizing circuit 152 is configured to perform a fourth control on the level of the first control node PD_CN1 in response to a second voltage-stabilizing signal, and the first control and the fourth control cause at least part of the first noise reduction control circuit 141 to be in different bias states. For example, as shown in FIG. 1C, in some embodiments, the second voltage-stabilizing circuit 152 may be connected to a second voltage-stabilizing terminal SVG2, a second voltage-stabilizing signal terminal SVGS2, and the first control node PD_CN1. In a case where the second voltage-stabilizing circuit 152 is turned on in response to the second voltage-stabilizing signal provided by the second voltage-stabilizing signal terminal SVGS2, the first control node PD_CN1 is connected to the second voltage-stabilizing terminal SVG2, thereby pulling down the voltage of the first control node PD_CN1 to a second voltage-stabilizing voltage output by the second voltage-stabilizing terminal SVG2, that is, pulling down the level of the first control node PD_CN1 to the level of the second voltage-stabilizing voltage. In addition, as shown in FIG. 1D, in other embodiments, the second voltage-stabilizing circuit 152 may be connected to the second voltage-stabilizing terminal SVG2, the third node PD2, and the first control node PD_CN1, and takes the voltage of the third node PD2 as the second voltage-stabilizing signal. In a case where the second voltage-stabilizing circuit 152 is turned on in response to the level of the third node PD2, the first control node PD_CN1 is connected to the second voltage-stabilizing terminal SVG2, thereby pulling down the level of the first control node PD_CN1 to the level of the second voltage-stabilizing voltage. The fourth control may include pulling down the level of the first control node PD_CN1 to the level of the second voltage-stabilizing voltage.

It should be noted that, in the embodiments of the present disclosure, the first voltage terminal VGL may be configured, for example, to maintain to input a first voltage with a DC low level; in a case where the first control circuit and the first noise reduction control circuit are in the working state, the second voltage terminal VGH1 may be configured, for example, to maintain to input a DC high level signal (for example, the second voltage has a high level at this time), and in a case where the first control circuit and the first noise reduction control circuit are in the idle state, the second voltage terminal VGH1 may be configured, for example, to maintain to input a DC low level signal (for example, the second voltage has a low level at this time); in a case where the second control circuit and the second noise reduction control circuit are in the working state, the third voltage terminal VGH2 may be configured, for example, to maintain to input a DC high level signal (for example, the third voltage has a high level at this time), and in a case where the second control circuit and the second noise reduction control circuit are in the idle state, the third voltage terminal VGH2 may be configured, for example, to maintain to input a DC low level signal (for example, the third voltage has a low level at this time); in a case where the first voltage-stabilizing circuit is in the working state, the first voltage-stabilizing terminal SVG1 may be configured, for example, to maintain to input a DC low level signal that has a level lower than the level of the first voltage provided by the first voltage terminal VGL, and in a case where the first voltage-stabilizing circuit is in the idle state, the first voltage-stabilizing terminal SVG1 may be configured, for example, to maintain to input a DC low level signal, which has the level that is the same as the level of the first voltage provided by the first voltage terminal VGL; in a case where the second voltage-stabilizing circuit is in the working state, the second voltage-stabilizing terminal SVG2 may be configured, for example, to maintain to input a DC low level signal that has a level lower than the level of the first voltage provided by the first voltage terminal VGL, and in a case where the second voltage-stabilizing circuit is in the idle state, the second voltage-stabilizing terminal SVG2 may be configured, for example, to maintain to input a DC low level signal, which has the level that is the same as the level of the first voltage provided by the first voltage terminal VGL. The following embodiments of the present disclosure are the same as those described herein, and similar portions will not be described again.

In addition, it should be noted that, in the embodiments of the present disclosure, because the first control circuit and the first noise reduction control circuit are in a complementary working state with the second control circuit and the second noise reduction control circuit, the level of the level signal input from the second voltage terminal VGH1 is also in a complementary state with the level of the level signal input from the third voltage terminal VGH2, that is, in a case where a DC high level signal is input to the second voltage terminal VGH1, a DC low level signal is input to the third voltage terminal VGH2, and in a case where the DC low level signal is input to the second voltage terminal VGH1, the DC high level signal is input to the third voltage terminal VGH2. The following embodiments of the present disclosure are the same as those described herein, and similar portions will not be described again.

Figure 2A:
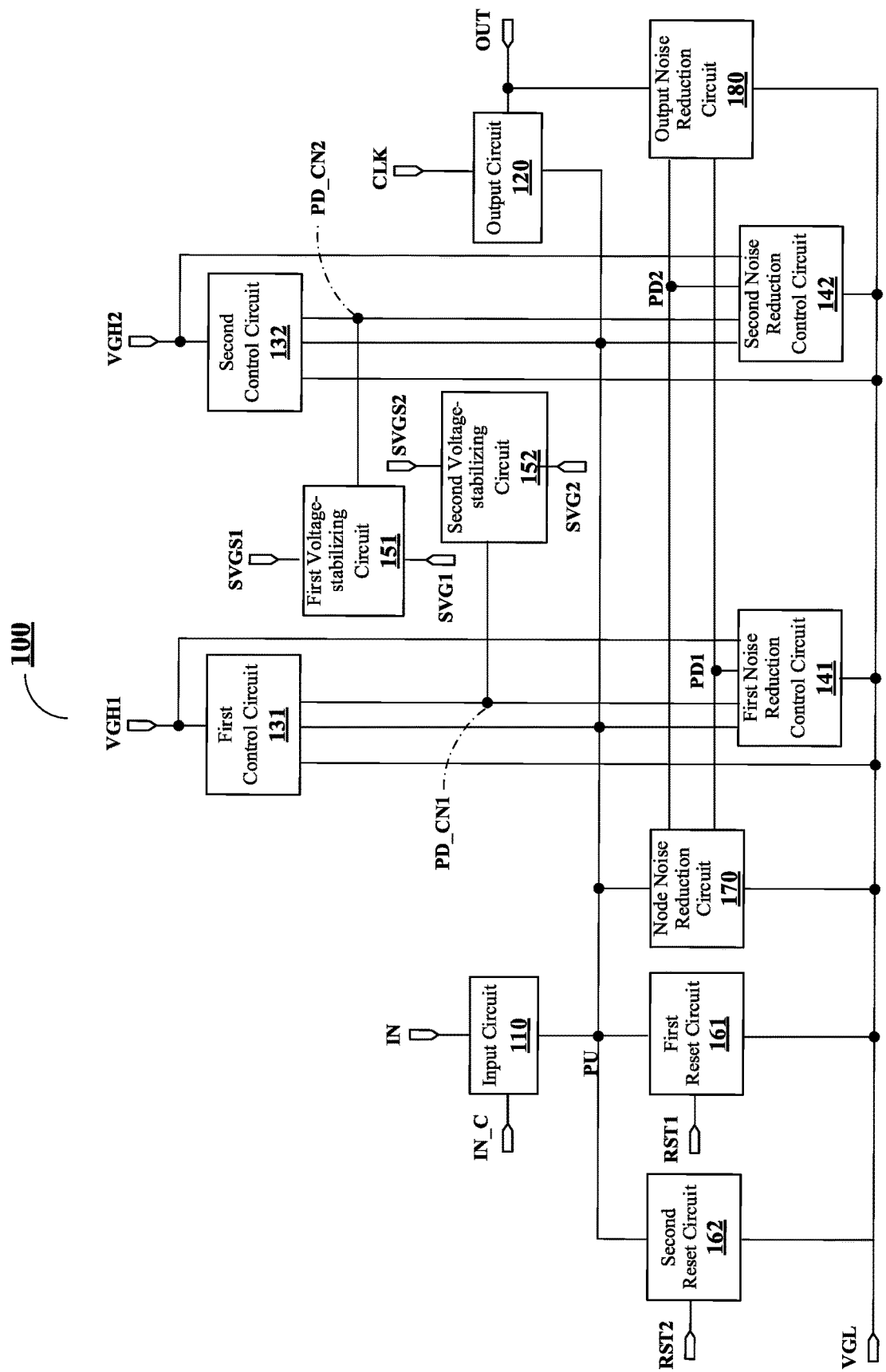
FIG. 2A is a schematic block diagram of yet another shift register unit provided by an embodiment of the present disclosure.
Figure 2B:
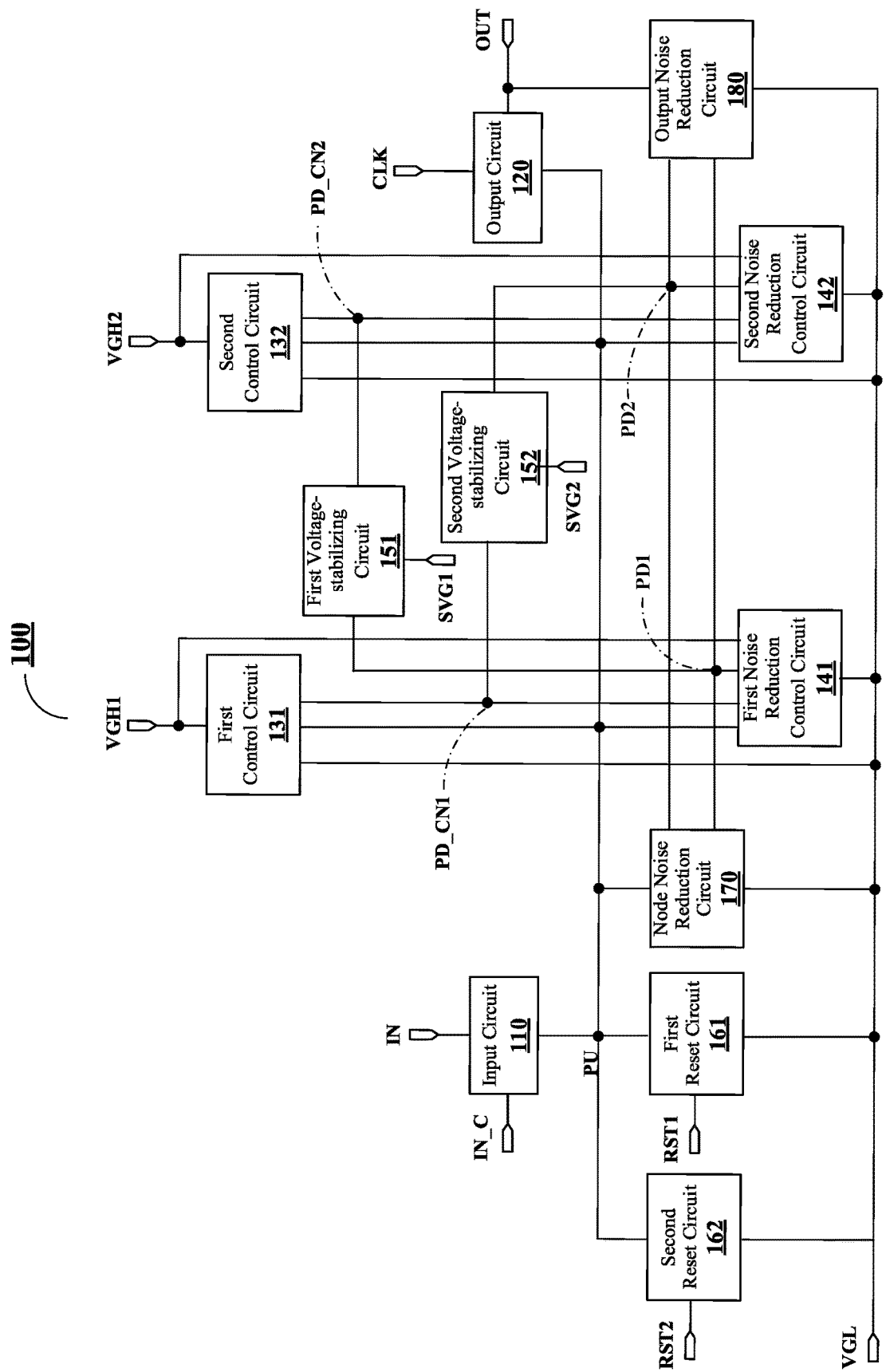
FIG. 2B is a schematic block diagram of yet another shift register unit provided by an embodiment of the present disclosure.

FIG. 2A is a block diagram of yet another shift register unit provided by an embodiment of the present disclosure. FIG. 2B is a block diagram of yet another shift register unit provided by an embodiment of the present disclosure. As shown in FIGS. 2A and 2B, the shift register unit 100 may further include a first reset circuit 161, a second reset circuit 162, a node noise reduction circuit 170, and an output noise reduction circuit 180.

The first reset circuit 161 is configured to reset the first node PU in response to a first reset signal. For example, as shown in FIGS. 2A and 2B, the first reset circuit 161 may be connected to the first voltage terminal VGL, a first reset signal terminal RST1, and the first node PU. In a case where the first reset circuit 161 is turned on in response to the first reset signal provided by the first reset signal terminal RST1, the first node PU is connected to the first voltage terminal VGL, so that the first voltage is written to the first node PU to reset the first node PU.

The second reset circuit 162 is configured to reset the first node PU in response to a frame reset signal. For example, as shown in FIGS. 2A and 2B, the second reset circuit 162 may be connected to the first voltage terminal VGL, a frame reset signal terminal RST2, and the first node PU. In a case where the first reset circuit 161 is turned on in response to the frame reset signal provided by the frame reset signal terminal RST2, the first node PU is connected to the first voltage terminal VGL, so that the first voltage is written to the first node PU to reset the first node PU. For example, the frame reset signal terminal RST2 is used to output an effective frame reset signal after the end of each frame time to control second reset circuits 162 in all shift register units in a gate driving circuit to reset corresponding first nodes PU, respectively.

The node noise reduction circuit 170 is configured to perform noise reduction on the first node PU under the control of the level of the second node PD1 and the level of the third node PD2. For example, as shown in FIGS. 2A and 2B, the node noise reduction circuit 170 may be connected to the first voltage terminal VGL, the first node PU, the second node PD1, and the third node PD2. In a case where the second node PD1 is at a high level, the first node PU is connected to the first voltage terminal VGL, so that the first voltage is written to the first node PU to pull down the first node PU to perform noise reduction; and in a case where the third node PD2 is at a high level, the first node PU is connected to the first voltage terminal VGL, so that the first voltage is written to the first node PU to perform noise reduction on the first node PU.

The output noise reduction circuit 180 is configured to perform noise reduction on the output terminal OUT under the control of the level of the second node PD1 and the level of the third node PD2. For example, as shown in FIGS. 2A and 2B, the output noise reduction circuit 180 may be connected to the first voltage terminal VGL, the output terminal OUT, the second node PD1, and the third node PD2. In a case where the second node PD1 is at a high level, the output terminal OUT is connected to the first voltage terminal VGL, thereby performing noise reduction on the output terminal OUT; and in a case where the third node PD2 is at a high level, the output terminal OUT is connected to the first voltage terminal VGL, thereby pulling down the output terminal OUT to perform noise reduction.

It should be noted that in the examples shown in FIGS. 2A and 2B, the first reset circuit 161, the second reset circuit 162, the node noise reduction circuit 170, and the output noise reduction circuit 180 are all connected to the first voltage terminal VGL to receive the DC low level signal, but the present disclosure is not limited thereto, the first reset circuit 161, the second reset circuit 162, the node noise reduction circuit 170, and the output noise reduction circuit 180 may also be connected to different power supply voltage terminals, respectively, to receive different low level signals, as long as the corresponding functions can be achieved, and the present disclosure does not specifically limit this.

Figure 3:
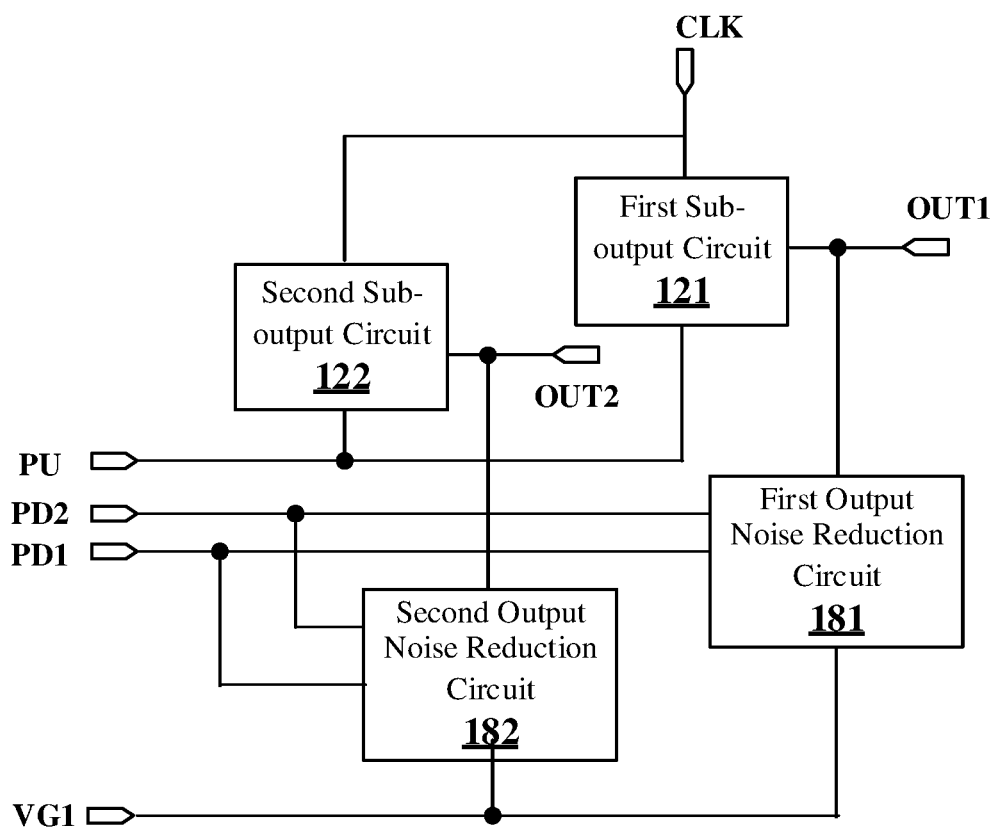
FIG. 3 is a schematic block diagram of an output circuit and an output noise reduction circuit of a shift register unit shown in FIGS. 2A and 2B.

FIG. 3 is a block diagram of an output circuit and an output noise reduction circuit included in the shift register unit in FIGS. 2A and 2B. As shown in FIG. 3, the output circuit 120 may include a first sub-output circuit 121 and a second sub-output circuit 122, and the output noise reduction circuit 180 may include a first output noise reduction circuit 181 and a second output noise reduction circuit 182. The output terminal OUT includes a shift signal output terminal OUT1 and a scan signal output terminal OUT2, and the output signal includes a first sub-output signal and a second sub-output signal.

The first sub-output circuit 121 is configured to output the first sub-output signal to the shift signal output terminal OUT1 under the control of the level of the first node PU. For example, the first sub-output circuit 121 may be connected to the first node PU, the clock signal terminal CLK, and the shift signal output terminal OUT1. In a case where the first sub-output circuit 121 is turned on under the control of the level of the first node PU, the clock signal terminal CLK is connected to the shift signal output terminal OUT1, so that the clock signal provided by the clock signal terminal CLK is output to the shift signal output terminal OUT1 as the first sub-output signal.

The second sub-output circuit 122 is configured to output the second sub-output signal to the scan signal output terminal OUT2 under the control of the level of the first node PU. For example, the second sub-output circuit 122 may be connected to the first node PU, the clock signal terminal CLK, and the scan signal output terminal OUT2. In a case where the second sub-output circuit 122 is turned on under the control of the level of the first node PU, the clock signal terminal CLK is connected to the scan signal output terminal OUT2, so that the clock signal provided by the clock signal terminal CLK is output to the scan signal output terminal OUT2 as the second sub-output signal.

For example, in a case where a plurality of shift register units are cascaded to obtain a gate driving circuit, the shift signal output terminal OUT1 is configured to provide an input signal to the next-stage shift register unit, and the scan signal output terminal OUT2 is configured to be connected to a gate line to output a scan driving signal to the gate line. For example, the output signal of the shift signal output terminal OUT1 is the same as the output signal of the scan signal output terminal OUT2.

The first output noise reduction circuit 181 is configured to perform noise reduction on the shift signal output terminal OUT1 under the control of the level of the second node PD1 and the level of the third node PD2. For example, the first output noise reduction circuit 181 may be connected to the first voltage terminal VGL, the shift signal output terminal OUT1, the second node PD1, and the third node PD2. In a case where the second node PD1 is at a high level, the first output noise circuit 181 is configured to connect the shift signal output terminal OUT1 to the first voltage terminal VGL, thereby performing noise reduction on the shift signal output terminal OUT1; and in a case where the third node PD2 is at a high level, the first output noise reduction circuit 181 is configured to connect the shift signal output terminal OUT1 to the first voltage terminal VGL, thereby performing noise reduction on the shift signal output terminal OUT1.

The second output noise reduction circuit 182 is configured to perform noise reduction on the scan signal output terminal OUT2 under the control of the level of the second node PD1 and the level of the third node PD2. For example, the second output noise reduction circuit 182 may be connected to the first voltage terminal VGL, the scan signal output terminal OUT2, the second node PD1, and the third node PD2. In a case where the second node PD1 is at a high level, the second output noise reduction circuit 182 is configured to connect the scan signal output terminal OUT2 to the first voltage terminal VGL, thereby performing noise reduction on the scan signal output terminal OUT2; and in a case where the third node PD2 is at a high level, the second output noise reduction circuit 182 is configured to connect the scan signal output terminal OUT2 to the first voltage terminal VGL, thereby performing noise reduction on the scan signal output terminal OUT2.

Figure 4A:
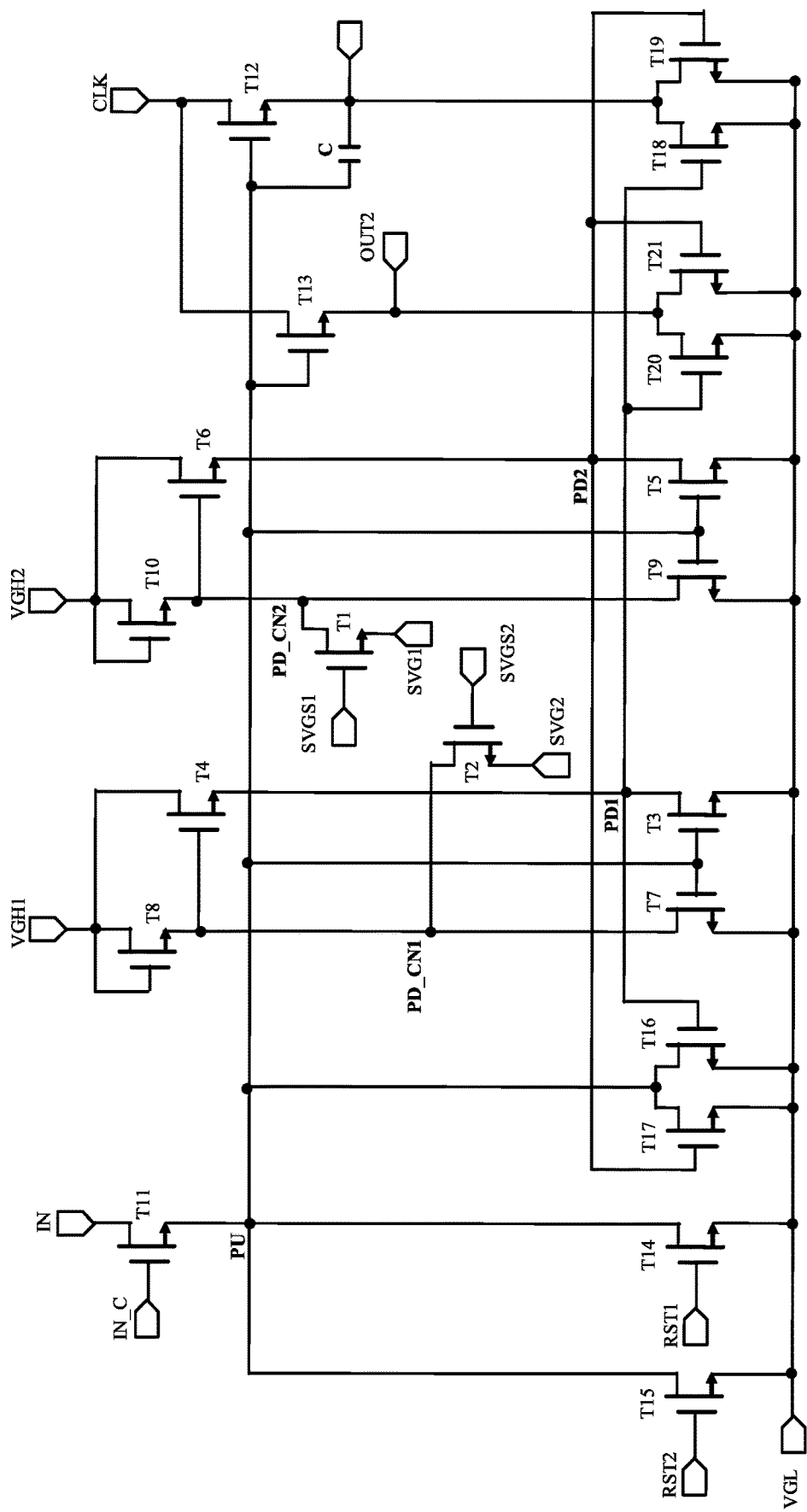
FIG. 4A is a circuit structure diagram of a shift register unit shown in FIG. 2A.
Figure 4B:
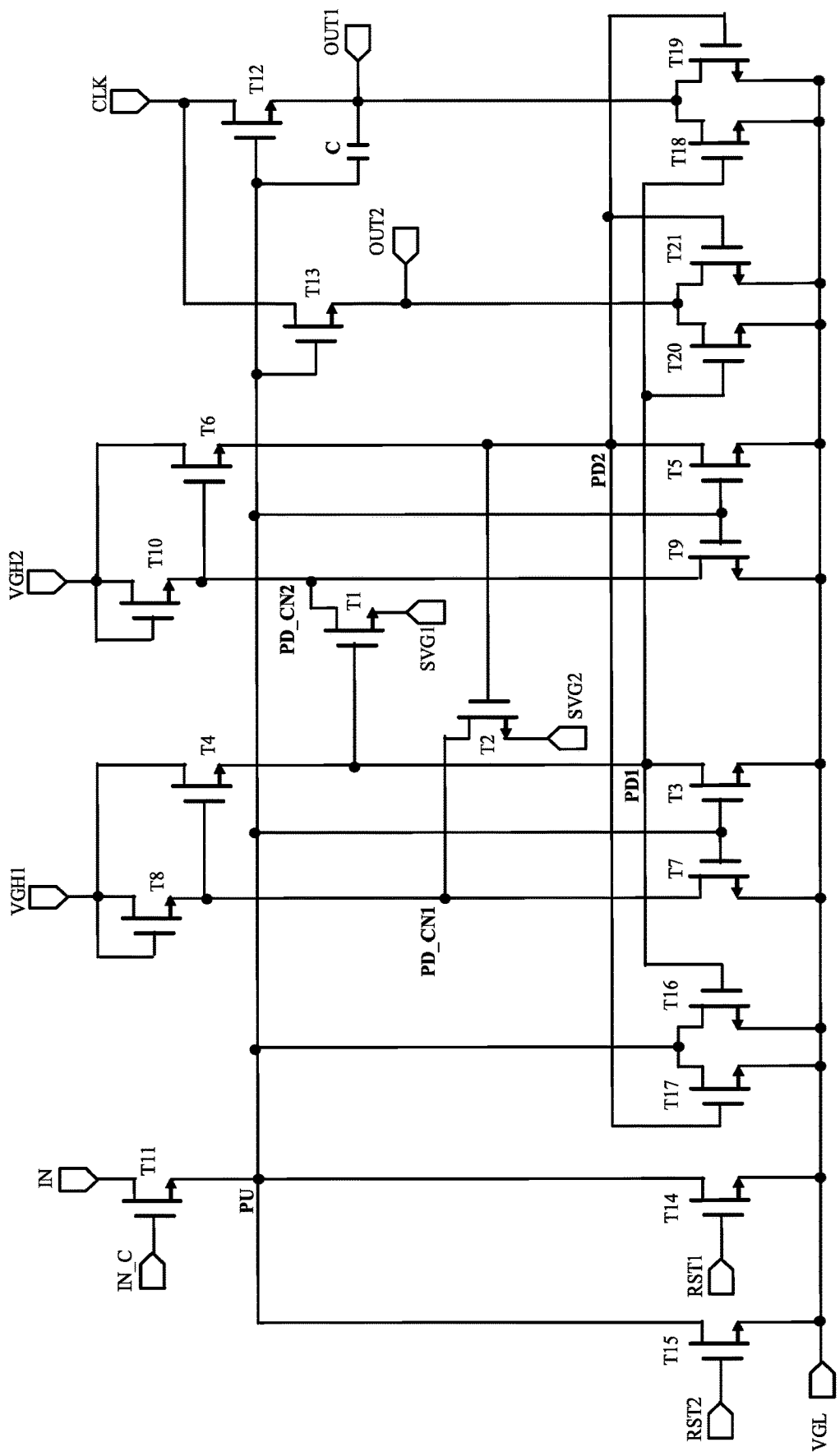
FIG. 4B is a circuit structure diagram of a shift register unit shown in FIG. 2B.

FIG. 4A is a circuit structure diagram of the shift register unit shown in FIGS. 2A and 3. FIG. 4B is a circuit structure diagram of the shift register unit shown in FIGS. 2B and 3.

In the following description of the present disclosure, the case where each transistor is an N-type transistor is taken as an example, but this does not constitute a limitation on the embodiments of the present disclosure.

As shown in FIGS. 4A and 4B, the first voltage-stabilizing circuit 151 may include a first transistor T1. In some examples, as shown in FIG. 4A, a gate electrode of the first transistor T1 is connected to the first voltage-stabilizing signal terminal SVGS1 to receive the first voltage-stabilizing signal, a first electrode of the first transistor is connected to the second control node PD_CN2, and a second electrode of the first transistor T1 is connected to the first voltage-stabilizing terminal SVG1 to receive the first voltage-stabilizing voltage.

As shown in FIG. 4B, in other examples, the gate electrode of the first transistor T1 may be connected to the second node PD1 to receive the voltage of the second node PD1 as the first voltage-stabilizing signal, the first electrode of the first transistor T1 is connected to the second control node PD_CN2, and the second electrode of the first transistor T1 is connected to the first voltage-stabilizing terminal SVG1 to receive the first voltage-stabilizing voltage.

As shown in FIGS. 4A and 4B, the second voltage-stabilizing circuit 152 may include a second transistor T2. In some examples, as shown in FIG. 4A, a gate electrode of the second transistor T2 is connected to the second voltage-stabilizing signal terminal SVGS2 to receive the second voltage-stabilizing signal, a first electrode of the second transistor is connected to the first control node PD_CN1, and a second electrode of the second transistor T2 is connected to the second voltage-stabilizing terminal SVG2 to receive the second voltage-stabilizing voltage.

As shown in FIG. 4B, in other examples, the gate electrode of the second transistor T2 is connected to the third node PD2 to receive the voltage of the third node PD2 as the second voltage-stabilizing signal, the first electrode of the second transistor is connected to the first control node PD_CN1, and the second electrode of the second transistor T2 is connected to the second voltage-stabilizing terminal SVG2 to receive the second voltage-stabilizing voltage.

As shown in FIGS. 4A and 4B, the first noise reduction control circuit 141 may include a third transistor T3 and a fourth transistor T4. A gate electrode of the third transistor T3 is connected to the first node PU, a first electrode of the third transistor T3 is connected to the second node PD1, and a second electrode of the third transistor T3 is connected to the first voltage terminal VGL to receive the first voltage; a gate electrode of the fourth transistor T4 is connected to the first control node PD_CN1, a first electrode of the fourth transistor T4 is connected to the second voltage terminal VGH1 to receive the second voltage, and a second electrode of the fourth transistor T4 is connected to the second node PD1.

For example, the first control and the fourth control cause the fourth transistor T4 to be in different bias states. For example, the first control may cause the fourth transistor T4 to be in a forward bias state or an unbiased state. In a case where the first control includes pulling up the level of the first control node PD_CN1 to the high level of the second voltage, the fourth transistor T4 is in a forward bias state, that is, in this case, a difference Vgs4 between a gate voltage and a source voltage (the gate voltage minus the source voltage) of the fourth transistor T4 is greater than the threshold voltage of the fourth transistor T4; and in a case where the first control includes pulling down the level of the first control node PD_CN1 to the low level of the first voltage, the fourth transistor T4 is in an unbiased state, that is, in this case, the difference Vgs4 between the gate voltage and the source voltage of the fourth transistor T4 is 0 volts (V). The fourth control includes pulling down the level of the first control node PD_CN1 to the level of the second voltage-stabilizing voltage. In this case, the fourth transistor T4 may be in a reverse bias state, that is, in this case, the difference Vgs4 between the gate voltage and the source voltage (the gate voltage minus the source voltage) of the fourth transistor T4 is less than the threshold voltage of the fourth transistor T4. Thus, the first control and the fourth control can cause the fourth transistor T4 to be in a bias state, which alternately changes, thereby making the threshold voltage of the fourth transistor T4 relatively stable.

As shown in FIGS. 4A and 4B, the second noise reduction control circuit 142 may include a fifth transistor T5 and a sixth transistor T6. A gate electrode of the fifth transistor T5 is connected to the first node PU, a first electrode of the fifth transistor T5 is connected to the third node PD2, and a second electrode of the fifth transistor T5 is connected to the first voltage terminal VGL to receive the first voltage; a gate electrode of the sixth transistor T6 is connected to the second control node PD_CN2, a first electrode of the sixth transistor T6 is connected to the third voltage terminal VGH2 to receive the third voltage, and a second electrode of the sixth transistor T6 is connected to the third node PD2.

For example, the second control and the third control cause the sixth transistor T6 to be in different bias states. For example, the second control may cause the sixth transistor T6 to be in a forward bias state or an unbiased state. In a case where the second control includes pulling up the level of the second control node PD_CN2 to the high level of the third voltage, the sixth transistor T6 is in a forward bias state, that is, in this case, a difference Vgs6 between a gate voltage and a source voltage (the gate voltage minus the source voltage) of the sixth transistor T6 is greater than the threshold voltage of the sixth transistor T6; and in a case where the second control includes pulling down the level of the second control node PD_CN2 to the low level of the first voltage, the sixth transistor T6 is in an unbiased state, that is, in this case, the difference Vgs6 between the gate voltage and the source voltage of the sixth transistor T6 is 0 volts (V). The third control includes pulling down the level of the second control node PD_CN2 to the level of the first voltage-stabilizing voltage. In this case, the sixth transistor T6 may be in a reverse bias state, that is, in this case, the difference Vgs6 between the gate voltage and the source voltage (the gate voltage minus the source voltage) of the sixth transistor T6 is less than the threshold voltage of the sixth transistor T6. Thus, the second control and the third control can cause the sixth transistor T6 to be in a bias state, which alternately changes, thereby making the threshold voltage of the sixth transistor T6 relatively stable.

As shown in FIGS. 4A and 4B, the first control circuit 131 may include a seventh transistor T7 and an eighth transistor T8. A gate electrode of the seventh transistor T7 is connected to the first node PU, a first electrode of the seventh transistor T7 is connected to the first control node PD_CN1, and a second electrode of the seventh transistor T7 is connected to the first voltage terminal VGL to receive the first voltage; a gate electrode of the eighth transistor T8 is connected to a first electrode of the eighth transistor T8, and is connected to the second voltage terminal VGH1 to receive the second voltage, and a second electrode of the eighth transistor T8 is connected to the first control node PD_CN1.

For example, in a case where the first node PU is at an effective level (e.g., a high level), the seventh transistor T7 is turned on. By designing a proportional relationship between the channel width-to-length ratio of the seventh transistor T7 and the channel width-to-length ratio of the eighth transistor T8 that is turned on, the potential of the first control node PD_CN1 can be pulled down to the low level of the first voltage. For example, the channel width-to-length ratio of the seventh transistor T7 is greater than that of the eighth transistor T8. In a case where the first node PU is at a low level, the seventh transistor T7 is turned off, and if the eighth transistor T8 is turned on, the high level signal provided by the second voltage terminal VGH1 is written to the first control node PD_CN1 through the eighth transistor T8 to pull up the potential of the first control node PD_CN1 to the high level of the second voltage.

As shown in FIGS. 4A and 4B, the second control circuit 132 may include a ninth transistor T9 and a tenth transistor T10. A gate electrode of the ninth transistor T9 is connected to the first node PU, a first electrode of the ninth transistor T9 is connected to the second control node PD_CN2, and a second electrode of the ninth transistor T9 is connected to the first voltage terminal VGL to receive the first voltage; a gate electrode of the tenth transistor T10 is connected to a first electrode of the tenth transistor T10, and is connected to the third voltage terminal VGH2 to receive the third voltage, and a second electrode of the tenth transistor T10 is connected to the second control node PD_CN2.

For example, in a case where the first node PU is at an effective level (e.g., a high level), the ninth transistor T9 is turned on. By designing a proportional relationship between the channel width-to-length ratio of the ninth transistor T9 and the channel width-to-length ratio of the tenth transistor T10 that is turned on, the potential of the second control node PD_CN2 can be pulled down to the low level of the first voltage. For example, the channel width-to-length ratio of the ninth transistor T9 is greater than that of the tenth transistor T10. In a case where the first node PU is at a low level, the ninth transistor T9 is turned off, and if the tenth transistor T10 is turned on, the high level signal provided by the third voltage terminal VGH2 is written to the second control node PD_CN2 through the tenth transistor T10 to pull up the potential of the second control node PD_CN2 to the high level of the third voltage.

As shown in FIGS. 4A and 4B, the input circuit 110 may include an eleventh transistor T11. A gate electrode of the eleventh transistor T11 is connected to the input control signal terminal to receive the input control signal, a first electrode of the eleventh transistor T11 is connected to the input terminal IN to receive the input signal, and a second electrode of the eleventh transistor T11 is connected to the first node PU to input the input signal to the first node PU. In a case where the input control signal is at an effective level (e.g., a high level), the eleventh transistor T11 is turned on to connect the input terminal IN to the first node PU, so that the input signal is input to the first node PU to pull up the potential of the first node PU to the working potential. In addition, in some embodiments, the input signal may be the same as the input control signal, in this case, the gate electrode of the eleventh transistor T11 may be connected to the first electrode of the eleventh transistor T11, and both the first electrode and the gate electrode of the eleventh transistor T11 are connected to the input terminal IN to receive the input signal. In this case, the input signal can be used as the input control signal, thereby reducing the number of signal terminals and saving production costs.

As shown in FIGS. 4A and 4B, the first sub-output circuit 121 may include a twelfth transistor T12 and a storage capacitor C. A gate electrode of the twelfth transistor T12 is connected to the first node PU, a first electrode of the twelfth transistor T12 is connected to the clock signal terminal CLK to receive the clock signal, and a second electrode of the twelfth transistor T12 is connected to the shift signal output terminal OUT1; a first electrode of the storage capacitor C is connected to the gate electrode of the twelfth transistor T12, and a second electrode of the storage capacitor C is connected to the second electrode of the twelfth transistor T12. For example, in a case where the first node PU is at a working potential (e.g., a high level), the twelfth transistor T12 is turned on, thereby outputting the clock signal to the shift signal output terminal OUT1 as the first sub-output signal.

It should be noted that in the various embodiments of the present disclosure, the storage capacitor C may be a capacitor device prepared by a manufacturing process, for example, a capacitor device achieved by manufacturing special capacitor electrodes, and the respective electrodes of the storage capacitor C may be achieved by a metal layer, a semiconductor layer (e.g., doped polysilicon), or the like. The storage capacitor C can also be a parasitic capacitor between the transistors, and can be achieved by the transistor itself and other devices and wire circuits, as long as the level of the first node PU can be maintained and a bootstrap effect can be achieved when the shift signal output terminal OUT1 or the scan signal output terminal OUT2 outputs a signal.

As shown in FIGS. 4A and 4B, the second sub-output circuit 122 may include a thirteenth transistor T13. A gate electrode of the thirteenth transistor T13 is connected to the first node PU, a first electrode of the thirteenth transistor T13 is connected to the clock signal terminal CLK to receive the clock signal, and a second electrode of the thirteenth transistor T13 is connected to the scan signal output terminal OUT2. For example, in a case where the first node PU is at a working potential (e.g., a high level), the thirteenth transistor T13 is turned on, thereby outputting the clock signal to the scan signal output terminal OUT2 as the second sub-output signal.

As shown in FIGS. 4A and 4B, the first reset circuit 161 may include a fourteenth transistor T14. A gate electrode of the fourteenth transistor T14 is connected to the first reset terminal RST to receive the first reset signal, a first electrode of the fourteenth transistor T14 is connected to the first node PU to reset the first node PU, and a second electrode of the fourteenth transistor T14 is connected to the first voltage terminal VGL to receive the first voltage.

As shown in FIGS. 4A and 4B, the second reset circuit 162 may include a fifteenth transistor T15. A gate electrode of the fifteenth transistor T15 is connected to the frame reset signal terminal RST2 to receive the frame reset signal, a first electrode of the fifteenth transistor T15 is connected to the first node PU to reset the first node PU, and a second electrode of the fifteenth transistor T15 is connected to the first voltage terminal VGL to receive the first voltage.

As shown in FIGS. 4A and 4B, the node noise reduction circuit 170 may include a sixteenth transistor T16 and a seventeenth transistor T17. A gate electrode of the sixteenth transistor T16 is connected to the second node PD1, a first electrode of the sixteenth transistor T16 is connected to the first node PU to perform noise reduction on the first node PU, and a second electrode of the sixteenth transistor T16 is connected to the first voltage terminal VGL to receive the first voltage; a gate electrode of the seventeenth transistor T17 is connected to the third node PD2, a first electrode of the seventeenth transistor T17 is connected to the first node PU to perform noise reduction on the first node PU, and a second electrode of the seventeenth transistor T17 is connected to the first voltage terminal VGL to receive the first voltage.

As shown in FIGS. 4A and 4B, the first output noise reduction circuit may include an eighteenth transistor T18 and a nineteenth transistor T19. A gate electrode of the eighteenth transistor T18 is connected to the second node PD1, a first electrode of the eighteenth transistor T18 is connected to the shift signal output terminal OUT1, and a second electrode of the eighteenth transistor T18 is connected to the first voltage terminal VGL to receive the first voltage; a gate electrode of the nineteenth transistor T19 is connected to the third node PD2, a first electrode of the nineteenth transistor T19 is connected to the shift signal output terminal OUT1, and a second electrode of the nineteenth transistor T19 is connected to the first voltage terminal VGL to receive the first voltage.

As shown in FIGS. 4A and 4B, the second output noise reduction circuit may include a twentieth transistor T20 and a twenty-first transistor T21. A gate electrode of the twentieth transistor T20 is connected to the second node PD1, a first electrode of the twentieth transistor T20 is connected to the scan signal output terminal OUT2, and a second electrode of the twentieth transistor T20 is connected to the first voltage terminal VGL to receive the first voltage; a gate electrode of the twenty-first transistor T21 is connected to the third node PD2, a first electrode of the twenty-first transistor T21 is connected to the scan signal output terminal OUT2, and a second electrode of the twenty-first transistor T21 is connected to the first voltage terminal VGL to receive the first voltage.

For example, in a case where the second node PD1 is at an effective level (e.g., a high level), the sixteenth transistor T16, the eighteenth transistor T18, and the twentieth transistor T20 are all turned on, and the first node PU, the shift signal output terminal OUT1, and the scan signal output terminal OUT2 are all connected to the first voltage terminal VGL, thereby simultaneously performing noise reduction on the first node PU, the shift signal output terminal OUT1, and the scan signal output terminal OUT2.

For example, in a case where the third node PD2 is at an effective level (e.g., a high level), the seventeenth transistor T17, the nineteenth transistor T19, and the twenty-first transistor T21 are all turned on, and the first node PU, the shift signal output terminal OUT1, and the scan signal output terminal OUT2 are all connected to the first voltage terminal VGL, thereby simultaneously performing noise reduction on the first node PU, the shift signal output terminal OUT1, and the scan signal output terminal OUT2.

It should be noted that the transistors adopted in the embodiments of the present disclosure may all be thin film transistors (TFTs) or field-effect transistors (FETs) or other switching elements with the same characteristics, and the embodiments of the present disclosure are described by taking thin film transistors as an example. The source electrode and the drain electrode of a transistor adopted here may be symmetrical in structure, so the source electrode and the drain electrode of the transistor may have no difference in structure. In the embodiments of the present disclosure, in order to distinguish two electrodes of the transistor except for the gate electrode, one electrode of the two electrodes is directly described as the first electrode and the other electrode of the two electrodes is directly described as the second electrode.

In addition, the transistors in the embodiments of the present disclosure are all described by using N-type transistors as an example. In this case, the first electrode of the transistor is the drain electrode, and the second electrode is the source electrode. It should be noted that the present disclosure includes but is not limited to this aspect. For example, one or more transistors in the shift register unit provided by the embodiments of the present disclosure may also adopt P-type transistors. In this case, the first electrode of the transistor is the source electrode, and the second electrode is the drain electrode, as long as respective electrodes of a selected type transistor are correspondingly connected in accordance with respective electrodes of a corresponding transistor in the embodiment of the present disclosure, and the corresponding voltage terminals provide corresponding high or low voltages. In a case where an N-type transistor is adopted, Indium Gallium Zinc Oxide (IGZO) can be used as the active layer of the thin film transistor, which may effectively reduce the size of the transistor and prevent leakage current compared with using Low Temperature Poly Silicon (LTPS) or amorphous silicon (such as hydrogenated amorphous silicon) as the active layer of the thin film transistor.

Figure 5A:
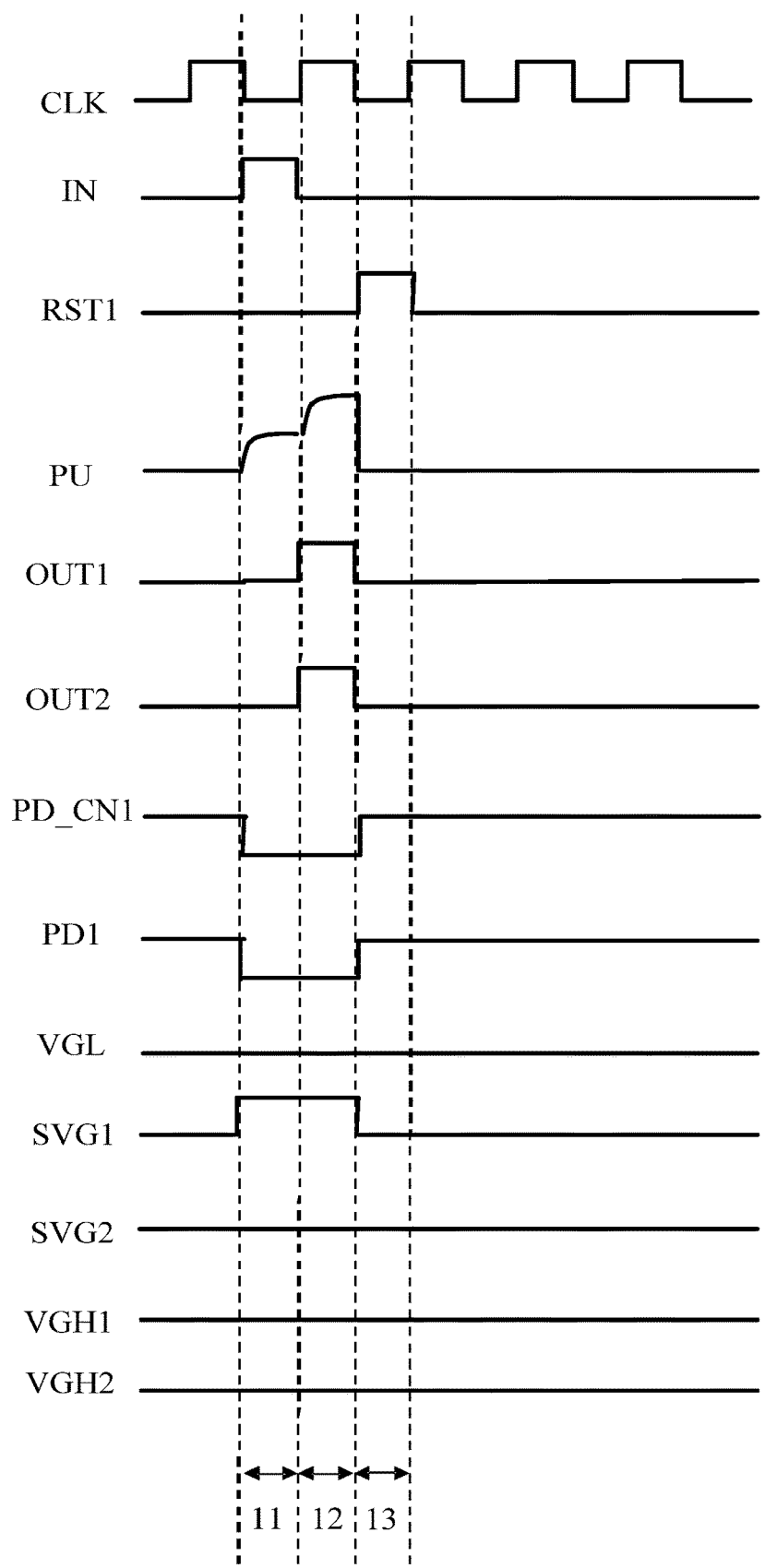
FIG. 5A is a signal timing diagram of a shift register unit provided by an embodiment of the present disclosure.
Figure 5B:
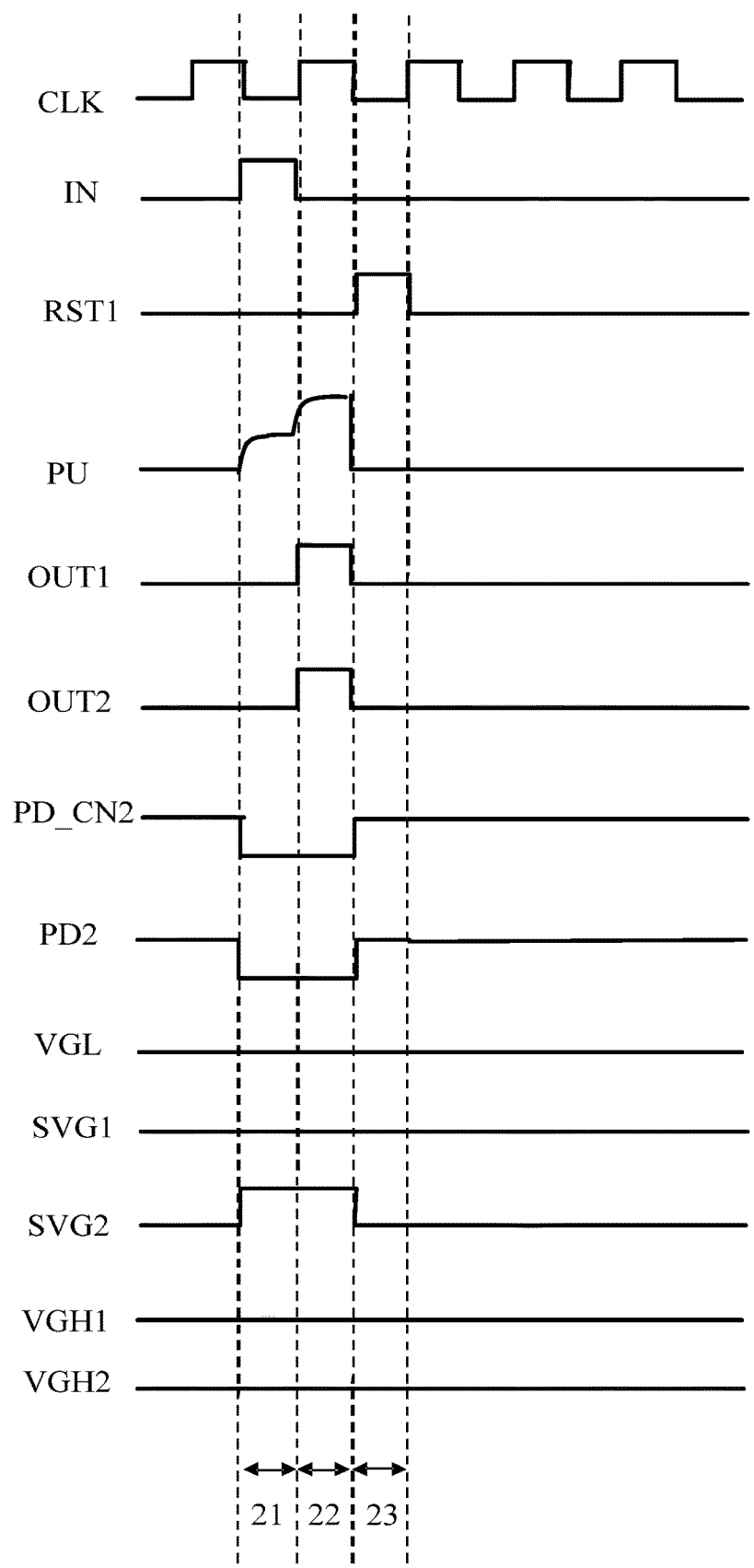
FIG. 5B is another signal timing diagram of a shift register unit provided by an embodiment of the present disclosure.

FIG. 5A is a signal timing diagram of a shift register unit provided by an embodiment of the present disclosure. FIG. 5B is another signal timing diagram of a shift register unit provided by an embodiment of the present disclosure. The working principle of the shift register unit 100 shown in FIG. 4B is described below with reference to the signal timing diagrams shown in FIGS. 5A and 5B. The working principle of the shift register unit 100 shown in FIG. 4A is similar to that of the shift register unit 100 shown in FIG. 4B, and will not be described again. It should be noted that the levels of the potentials in the signal timing diagram shown in FIGS. 5A and 5B are only schematic, and do not represent the true potential value.

In FIGS. 5A and 5B and the following description, IN, CLK, VGL, VGH1, VGH2, SVG1, SVG2, RST1, and RST2 are used to represent the corresponding signal terminals as well as the corresponding signals.

Figure 5C:
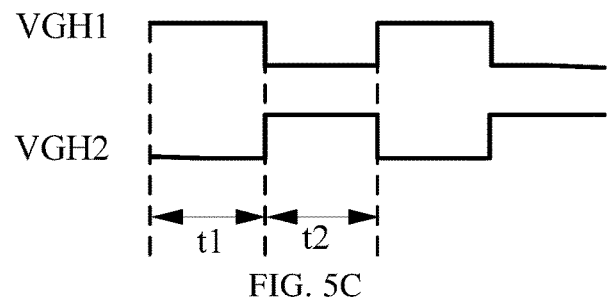
FIG. 5C is a signal timing diagram of a second voltage terminal and a third voltage terminal of a shift register unit provided by an embodiment of the present disclosure.

FIG. 5C is a signal timing diagram of a second voltage terminal and a third voltage terminal of a shift register unit according to an embodiment of the present disclosure.

As shown in FIG. 5C, during a time period t1, the second voltage terminal VGH1 is at a high level and the third voltage terminal VGH2 is at a low level. In some examples, the second voltage output from the second voltage terminal VGH1 is 32V, and the third voltage output from the third voltage terminal VGH2 is −8V. During a time period t2, the second voltage terminal VGH1 is at a low level and the third voltage terminal VGH2 is at a high level. In some examples, the second voltage output from the second voltage terminal VGH1 is −8V, and the third voltage output form the third voltage terminal VGH2 is 32V. The time period t1 is 2 seconds, and the time period t2 is also 2 seconds. The time period t1 and the time period t2 are one cycle of the second voltage output form the second voltage terminal VGH1, and the time period t1 and the time period t2 are one cycle of the third voltage output from the third voltage terminal VGH2.

In a first stage 11, a second stage 12, and a third stage 13 shown in FIG. 5A and a first stage 21, a second stage 22, and a third stage 23 shown in FIG. 5B, the shift register unit 100 shown in FIG. 4B can perform the following operations, respectively.

First, in the case where the first control circuit 131 and the first noise reduction control circuit 141 are in a working state and the second control circuit 132 and the second noise reduction control circuit 142 are in an idle state, that is, in the case where the second voltage terminal VGH1 is at a high level and the third voltage terminal VGH2 is at a low level, that is, in the time period t1 shown in FIG. 5C, the working principle of the shift register unit 100 shown in FIG. 4B will be described with reference to FIG. 5A.

As shown in FIG. 5A, in the first stage 11, in the input circuit 110, the input signal IN is at a high level, the eleventh transistor T11 is turned on, and the input signal IN is input to the first node PU, thereby pulling up the first node PU to a high level. In the first control circuit 131, the first node PU is at a high level, the seventh transistor T7 is turned on, and the first control node PD_CN1 is connected to the first voltage terminal VGL, thereby pulling down the first control node PD_CN1 to the low level of the first voltage VGL. In the first noise reduction control circuit 141, the first node PU is at a high level, the third transistor T3 is turned on, and the second node PD1 is connected to the first voltage terminal VGL, thereby pulling down the second node PD1 to the low level of the first voltage VGL. In the first voltage-stabilizing circuit 151, the second node PD1 is at a low level, and the first transistor T1 is turned off (i.e., the first voltage-stabilizing circuit 151 is in the idle state).

As shown in FIG. 5A, in the second stage 12, in the output circuit 120, the first node PU is maintained at the high level, and the twelfth transistor T12 and the thirteenth transistor T13 are turned on. The clock signal CLK is at a high level, and because of the bootstrap effect of the storage capacitor C, the level of the first node PU is further increased, the twelfth transistor T12 and the thirteenth transistor T13 are more fully turned on, and the high level of the clock signal CLK is output to the shift signal output terminal OUT1 and the scan signal output terminal OUT2.

As shown in FIG. 5A, in the third stage 13, in the first reset circuit 161, the first reset signal RST1 is at a high level, so that the fourteenth transistor T14 is turned on, and the first node PU is connected to the first voltage terminal VGL, thereby resetting the first node PU. In the first control circuit 131, the first node PU is at a low level, the seventh transistor T7 is turned off, the first control node PD_CN1 is disconnected from the first voltage terminal VGL, and because the second voltage VGH1 is at a high level, the eighth transistor T8 is turned on, and the first control node PD_CN1 is connected to the second voltage terminal VGH1, thereby pulling up the first control node PD_CN1 to the high level of the second voltage. In the first noise reduction control circuit 141, the first node PU is at a low level, the third transistor T3 is turned off, the second node PD1 is disconnected from the first voltage terminal VGL, and because the first control node PD_CN1 is at a high level, the fourth transistor T4 is turned on, the second node PD1 is connected to the second voltage terminal VGH1, and the second voltage VGH1 is at a high level, thereby pulling up the second node PD1 to the high level of the second voltage. In the first voltage-stabilizing circuit 151, the second node PD1 is at a high level, the first transistor T1 is turned on (i.e., the first voltage-stabilizing circuit 151 is in the working state), the second control node PD_CN2 is connected to the first voltage-stabilizing terminal SVG1, thereby pulling down the second control node PD_CN2 to the low level of the first voltage-stabilizing voltage.

For example, in some examples, in the first stage 11, the input signal IN may be a high voltage signal of 32V, and in the second stage 12 and the third stage 13, the input signal IN may be a low voltage signal of −8V.

For example, in some examples, in the first stage 11, the voltage of the first node PU may be 30V, and in the second stage 12, the voltage of the first node PU may be further increased to 45V. In the third stage 13, the voltage of the first node PU is pulled down to −8V.

For example, in some examples, in the first stage 11, the second stage 12, and the third stage 13, the first voltage VGL is −8V, so that in the first stage 11 and the second stage 12, the voltage of the first control node PD_CN1 is −8V, and the voltage of the second node PD1 is also −8V. In the third stage 13, the voltage of the first control node PD_CN1 may be 28V, and the voltage of the second node PD1 may also be 28V.

For example, in some examples, in the first stage 11 and the second stage 12, the first reset signal RST1 may be −8V, and in the third stage 13, the first reset signal RST1 may be 32V.

For example, in some examples, in the first stage 11 and in the second stage 12, the first voltage-stabilizing voltage is −8V; and in the third stage 13, the first voltage-stabilizing voltage is −15V. In the first stage 11, the second stage 12, and the third stage 13, the second voltage-stabilizing voltage is −8V.

For example, in some examples, the high voltage of the clock signal CLK may be 32V, and the low voltage of the clock signal CLK may be −8V.

For example, in some examples, in the first stage 11 and the third stage 13, the first sub-output signal output from the shift signal output terminal OUT1 may be −8V, and the second sub-output signal output from the scan signal output terminal OUT2 may also be −8V. In the second stage 12, both the shift signal output terminal OUT1 and the scan signal output terminal OUT2 output high level signals, the first sub-output signal output from the shift signal output terminal OUT1 may be 30V, and the second sub-output signal output from the scan signal output terminal OUT2 may also be 30V.

It should be noted that the voltage values of the first node PU, the first control node PD_CN1, the second node PD1, the shift signal output terminal OUT1, and the scan signal output terminal OUT2 given in these examples are not voltage values under ideal conditions, but are voltage values given in consideration of actual conditions such as transistors having self-resistance and so on. For example, under ideal conditions, in the second stage 12, both the shift signal output terminal OUT1 and the scan signal output terminal OUT2 output the high level signals that are the same as the clock signal CLK, the first sub-output signal output from the shift signal output terminal OUT1 may be 32V, and the second sub-output signal output from the scan signal output terminal OUT2 may also be 32V.

Next, in the case where the first control circuit 131 and the first noise reduction control circuit 141 are in an idle state and the second control circuit 132 and the second noise reduction control circuit 142 are in a working state, that is, in the case where the second voltage terminal VGH1 is at a low level and the third voltage terminal VGH2 is at a high level, that is, in the time period t2 shown in FIG. 5C, the working principle of the shift register unit 100 shown in FIG. 4B will be described with reference to FIG. 5B.

As shown in FIG. 5B, in the first stage 21, in the input circuit 110, the input signal IN is at a high level, the eleventh transistor T11 is turned on, and the input signal IN is input to the first node PU, thereby pulling up the first node PU to a high level. In the second control circuit 132, the first node PU is at a high level, the ninth transistor T9 is turned on, and the second control node PD_CN2 is connected to the first voltage terminal VGL, thereby pulling down the second control node PD_CN2 to the low level of the first voltage VGL. In the second noise reduction control circuit 142, the first node PU is at a high level, the fifth transistor T5 is turned on, and the third node PD2 is connected to the first voltage terminal VGL, thereby pulling down the third node PD2 to the low level of the first voltage VGL. In the second voltage-stabilizing circuit 152, the third node PD2 is at a low level, and the second transistor T2 is turned off (i.e., the second voltage-stabilizing circuit 152 is in the idle state).

As shown in FIG. 5B, in the second stage 22, in the output circuit 120, the first node PU is maintained at the high level, and the twelfth transistor T12 and the thirteenth transistor T13 are turned on. The clock signal CLK is at a high level, and because of the bootstrap effect of the storage capacitor C, the level of the first node PU is further increased, the twelfth transistor T12 and the thirteenth transistor T13 are more fully turned on, and the high level of the clock signal CLK is output to the shift signal output terminal OUT1 and the scan signal output terminal OUT2.

As shown in FIG. 5B, in the third stage 23, in the first reset circuit 161, the first reset signal RST1 is at a high level, so that the fourteenth transistor T14 is turned on, and the first node PU is connected to the first voltage terminal VGL, thereby resetting the first node PU. In the second control circuit 132, the first node PU is at a low level, the ninth transistor T9 is turned off, the second control node PD_CN2 is disconnected from the first voltage terminal VGL, and because the third voltage VGH2 is at a high level, the tenth transistor T10 is turned on, and the second control node PD_CN2 is connected to the third voltage terminal VGH2, thereby pulling up the second control node PD_CN2 to the high level of the third voltage. In the second noise reduction control circuit 142, the first node PU is at a low level, the fifth transistor T5 is turned off, the third node PD2 is disconnected from the first voltage terminal VGL, and because the second control node PD_CN2 is at a high level, the sixth transistor T6 is turned on, the third node PD2 is connected to the third voltage terminal VGH2, and the third voltage VGH2 is at a high level, thereby pulling up the third node PD2 to the high level of the third voltage. In the second voltage-stabilizing circuit 152, the third node PD2 is at a high level, the second transistor T2 is turned on (i.e., the second voltage-stabilizing circuit 152 is in the working state), the first control node PD_CN1 is connected to the second voltage-stabilizing terminal SVG2, thereby pulling down the first control node PD_CN1 to the low level of the second voltage-stabilizing voltage.

For example, in some examples, in the first stage 21, the input signal IN may be a high voltage signal of 32V, and in the second stage 22 and the third stage 23, the input signal IN may be a low voltage signal of −8V.

For example, in some examples, in the first stage 21, the voltage of the first node PU may be 30V, and in the second stage 22, the voltage of the first node PU may be further increased to 45V. In the third stage 23, the voltage of the first node PU is pulled down to −8V.

For example, in some examples, in the first stage 21, the second stage 22, and the third stage 23, the first voltage VGL is −8V, so that in the first stage 21 and the second stage 22, the voltage of the second control node PD_CN2 is −8V, and the voltage of the third node PD2 is also −8V. In the third stage 23, the voltage of the second control node PD_CN2 may be 28V, and the voltage of the third node PD2 is also 28V.

For example, in some examples, in the first stage 21 and the second stage 22, the first reset signal RST1 may be −8V, and in the third stage 23, the first reset signal RST1 may be 32V.

For example, in some examples, in the first stage 21 and in the second stage 22, the second voltage-stabilizing voltage is −8V; and in the third stage 23, the second voltage-stabilizing voltage is −15V. In the first stage 21, the second stage 22, and the third stage 23, the first voltage-stabilizing voltage is −8V.

For example, in some examples, the high voltage of the clock signal CLK may be 32V, and the low voltage of the clock signal CLK may be −8V.

For example, in some examples, in the first stage 21 and the third stage 23, the first sub-output signal output from the shift signal output terminal OUT1 may be −8V, and the second sub-output signal output from the scan signal output terminal OUT2 may also be −8V. In the second stage 22, both the shift signal output terminal OUT1 and the scan signal output terminal OUT2 output high level signals, the first sub-output signal output from the shift signal output terminal OUT1 may be 30V, and the second sub-output signal output from the scan signal output terminal OUT2 may also be 30V.

It should be noted that the voltage values of the first node PU, the second control node PD_CN2, the third node PD2, the shift signal output terminal OUT1, and the scan signal output terminal OUT2 given in these examples are not voltage values under ideal conditions, but are voltage values given in consideration of actual conditions such as transistors having self-resistance and so on. For example, under ideal conditions, in the second stage 22, both the shift signal output terminal OUT1 and the scan signal output terminal OUT2 output the high level signals that are the same as the clock signal CLK, the first sub-output signal output from the shift signal output terminal OUT1 may be 32V, and the second sub-output signal output from the scan signal output terminal OUT2 may also be 32V.

In the shift register unit 100 shown in FIG. 4B, in the case where the first control circuit 131 and the first noise reduction control circuit 141 are in a working state, when the first node PU is at a low level, the first control circuit 131 pulls up the first control node PD_CN1 to a high level, and the fourth transistor T4 is controlled by a high level voltage. In this case, the fourth transistor T4 is in a forward bias state, and after the shift register unit operates for a long time, the threshold voltage of the fourth transistor T4 is likely to have a drift, such as a positive drift. In the case where the positive drift of the threshold voltage of the fourth transistor T4 is large, the high level written to the second node PD1 will be lower than the predetermined value when the second voltage is written to the second node PD1 through the fourth transistor T4, that is, the voltage of the second node PD1 may be attenuated, so that the node noise reduction circuit 170 cannot effectively perform noise reduction on the first node PU, and the twelfth transistor T12 and the thirteenth transistor T13 cannot be effectively turned off, thereby affecting the output signal of the output terminal OUT, for example, noise may be generated at the shift signal output terminal OUT1 and the scan signal output terminal OUT2. However, in the case where the first control circuit 131 and the first noise reduction control circuit 141 are in an idle state, when the first node PU is at a low level, the second voltage-stabilizing circuit 152 is in a working state, the first control node PD_CN1 is pulled down to a low level, and the fourth transistor T4 is controlled by a low level voltage (e.g., −15V). In this case, the fourth transistor T4 is in a reverse bias state. In this way, in the first noise reduction control circuit 141, the fourth transistor T4 is alternately controlled by the high level voltage and the low level voltage, so that the threshold voltage of the fourth transistor T4 can tend to be in a relatively stable state.

Similarly, in the shift register unit 100 shown in FIG. 4B, in the case where the second control circuit 132 and the second noise reduction control circuit 142 are in a working state, when the first node PU is at a low level, the second control circuit 132 pulls up the second control node PD_CN2 to a high level, and the sixth transistor T6 is controlled by a high level voltage. In this case, the sixth transistor T6 is in a forward bias state, and after the shift register unit operates for a long time, the threshold voltage of the sixth transistor T6 is likely to have a drift, such as a positive drift. In the case where the positive drift of the threshold voltage of the sixth transistor T6 is large, the high level written to the third node PD2 will be lower than the predetermined value when the third voltage is written to the third node PD2 through the sixth transistor T6, that is, the voltage of the third node PD2 is attenuated, so that the node noise reduction circuit 170 cannot effectively perform noise reduction on the first node PU, and the twelfth transistor T12 and the thirteenth transistor T13 cannot be effectively turned off, thereby affecting the output signal of the output terminal OUT, for example, noise may be generated at the shift signal output terminal OUT1 and the scan signal output terminal OUT2. However, in the case where the second control circuit 132 and the second noise reduction control circuit 142 are in an idle state, when the first node PU is at a low level, the first voltage-stabilizing circuit 151 is in a working state, the second control node PD_CN2 is pulled down to a low level, and the sixth transistor T6 is controlled by a low level voltage (e.g., −15V). In this case, the fourth transistor T4 is in a reverse bias state. In this way, in the second noise reduction control circuit 142, the sixth transistor T6 is alternately controlled by the high level voltage and the low level voltage, so that the threshold voltage of the sixth transistor T6 can tend to be in a relatively stable state.

It should be noted that in a case where the first voltage-stabilizing circuit 151 is in the idle state, the first voltage-stabilizing voltage SVG1 is consistent with the first voltage VGL, so that the first transistor T1 is neither controlled by the high level voltage nor the low level voltage, in this case, the first transistor T1 is in the unbiased state, and therefore, the first voltage-stabilizing circuit 151 in the idle state does not exert any influence on the normal operation of other circuits in the shift register unit 100. In a case where the first voltage-stabilizing circuit 151 is in a working state, the first voltage-stabilizing voltage SVG1 is less than the first voltage VGL, so that the sixth transistor T6 can be controlled by the low level voltage, in this case, the sixth transistor T6 is in the reverse bias state. Similarly, in a case where the second voltage-stabilizing circuit 152 is in an idle state, the second voltage-stabilizing voltage SVG2 is consistent with the first voltage VGL, so that the second transistor T2 is neither controlled by the high level voltage nor the low level voltage, in this case, the second transistor T2 is in an unbiased state, and therefore, the second voltage-stabilizing circuit 152 in the idle state does not exert any influence on the normal operation of other circuits in the shift register unit 100. In a case where the second voltage-stabilizing circuit 152 is in a working state, the second voltage-stabilizing voltage SVG2 is less than the first voltage VGL, so that the fourth transistor T4 can be controlled by the low level voltage, in this case, the fourth transistor T4 is in the reverse bias state.

At least one embodiment of the present disclosure also provides a gate driving circuit. The gate driving circuit includes the shift register unit according to any embodiment of the present disclosure. The gate driving circuit provided by the embodiments of the present disclosure can stabilize the threshold voltage of the transistor, thereby eliminating the influence of the drift of the threshold voltage of the transistor on the working performance of the gate driving circuit.

Figure 6:
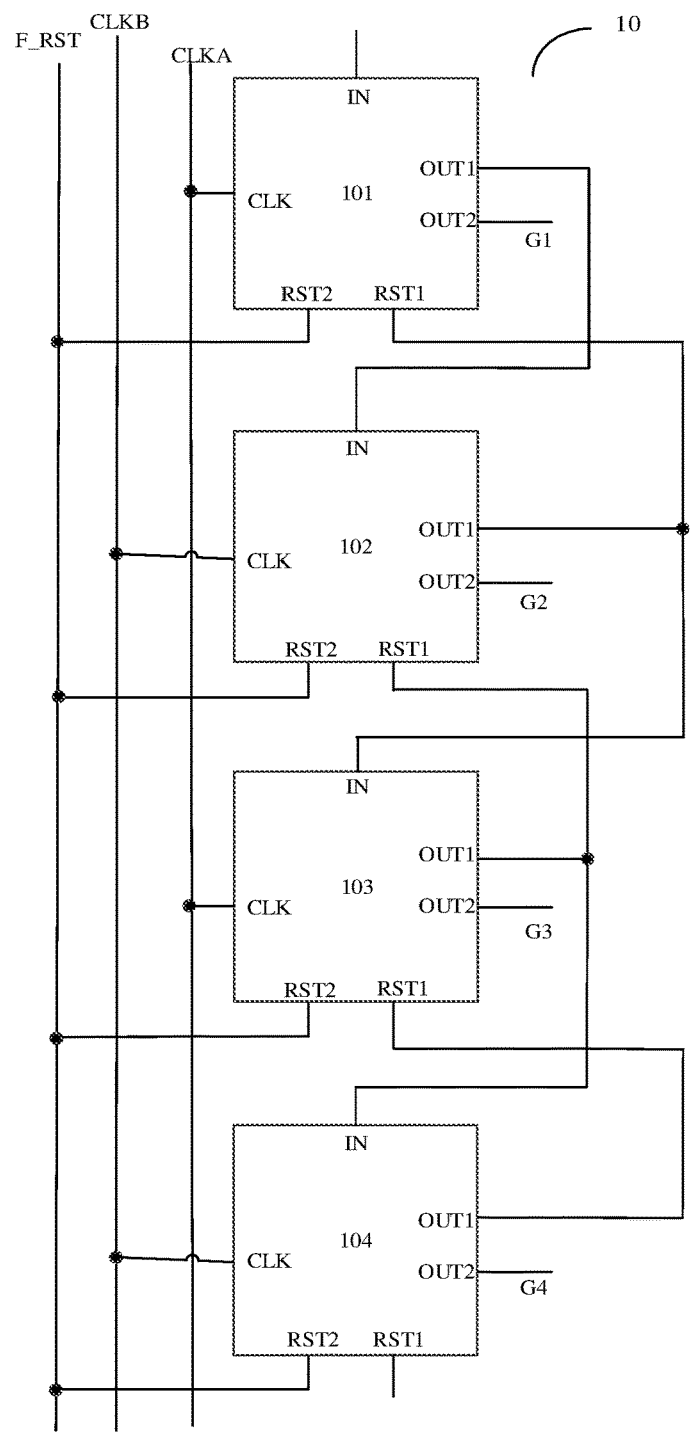
FIG. 6 is a schematic block diagram of a gate driving circuit provided by an embodiment of the present disclosure.

FIG. 6 is a schematic block diagram of a gate driving circuit provided by an embodiment of the present disclosure. As shown in FIG. 6, a gate driving circuit 10 may include a plurality of cascaded shift register units. For example, the gate driving circuit 10 may include a first shift register unit 101, a second shift register unit 102, a third shift register unit 103, and a fourth shift register unit 104, and part or all of the shift register units may adopt the shift register unit 100 provided by any embodiment of the present disclosure. The number of shift register units included in the gate driving circuit is not limited, and can be determined according to actual needs. As shown in FIG. 6, each shift register unit may have an input signal terminal IN, a clock signal terminal CLK, a shift signal output terminal OUT1, a scan signal output terminal OUT2, a first reset signal terminal RST1, and a frame reset signal terminal RST2.

For example, as shown in FIG. 6, except for the last-stage shift register unit (e.g., the fourth shift register unit 104), the first reset signal terminal RST1 of a remaining stage shift register unit is connected to the shift signal output terminal OUT1 of the next-stage shift register unit. Except for the first-stage shift register unit (e.g., the first shift register unit 101), the input signal terminal IN of the remaining stage shift register unit is connected to the shift signal output terminal OUT1 of the previous-stage shift register unit. The input signal terminal IN of the first-stage shift register unit may be configured to receive a trigger signal STV, and the first reset signal terminal RST1 of the last-stage shift register unit may be configured to receive a reset signal RESET. The trigger signal STV and the reset signal RESET are not shown in FIG. 6.

As shown in FIG. 6, the gate driving circuit 10 may further include a first clock signal line CLKA and a second clock signal line CLKB. For example, the first clock signal line CLKA is connected to a clock signal terminal CLK of a (2n−1)-th (n is an integer greater than 0) stage shift register unit. As shown in FIG. 6, the first clock signal line CLKA may be connected to the clock signal terminal CLK of the first shift register unit and the clock signal terminal CLK of the third shift register unit; the second clock signal line CLKB is connected to a clock signal terminal CLK of a (2n)-th stage shift register unit. As shown in FIG. 6, the second clock signal line CLKB may be connected to the clock signal terminal CLK of the second shift register unit and the clock signal terminal CLK of the fourth shift register unit. It should be noted that the embodiments of the present disclosure include but are not limited to the above connection modes. For example, the first clock signal line CLKA may be connected to the clock signal terminal CLK of the (2n)-th (n is an integer greater than 0) stage shift register unit, and the second clock signal line CLKB may be connected to the clock signal terminal CLK of the (2n−1)-th stage shift register unit.

For example, the timing of the clock signals provided on the first clock signal line CLKA and the second clock signal line CLKB may adopt the signal timing shown in FIG. 5 to achieve the function of the gate driving circuit 10 outputting the gate scan signals line by line.

As shown in FIG. 6, the gate driving circuit 10 may further include a frame reset signal line F_RST. For example, the frame reset signal line F_RST may be configured to be connected to the frame reset signal terminals RST2 of respective shift register units (e.g., the first shift register unit 101, the second shift register unit 102, the third shift register unit 103, and the fourth shift register unit 104).

The gate driving circuit 10 may further include a timing controller T-CON. For example, the timing controller T-CON is configured to be connected to the first clock signal line CLKA, the second clock signal line CLKB, and the frame reset signal line F_RST to provide clock signals and frame reset signals to the respective shift register units. The timing controller T-CON may also be configured to provide the trigger signal STV and the reset signal RESET. It should be noted that the phase relationship among a plurality of clock signals provided by the timing controller T-CON can be determined according to actual needs. In different examples, more clock signals can be provided according to different configurations.

For example, in a case where the gate driving circuit 10 is adopted to drive a display panel, the gate driving circuit 10 may be provided on a side of the display panel. For example, the gate driving circuit 10 may be directly integrated on the array substrate of the display panel by using the same manufacturing process as the thin film transistor, so as to achieve the progressive scan driving function. The display panel includes a plurality of rows of gate lines (e.g., G1, G2, G3, G4, etc.), and the scan signal output terminals OUT2 of the respective shift register units in the gate driving circuit 10 may be configured to be connected to the plurality of rows of gate lines in one-to-one correspondence, thereby outputting scan driving signals to the plurality of rows of gate lines. Of course, the gate driving circuits 10 may also be provided on both sides of the display panel to achieve bilateral driving. The embodiment of the present disclosure does not limit the manner of setting the gate driving circuit 10. For example, the gate driving circuit 10 may be provided on one side of the display panel for driving odd rows of gate lines, and the gate driving circuit 10 may be provided on the other side of the display panel for driving even rows of gate lines.

For the working principle of the gate driving circuit 10, reference may be made to the corresponding description of the working principle of the shift register unit 100 in the embodiments of the present disclosure, and similar portions will not be repeated here.

At least one embodiment of the present disclosure also provides a display device. The display device includes the gate driving circuit according to any embodiment of the present disclosure. The circuit of the gate driving circuit in the display device can stabilize the threshold voltage of the transistor, thereby eliminating the influence of the drift of the threshold voltage of the transistor on the working performance of the gate driving circuit.

Figure 7:
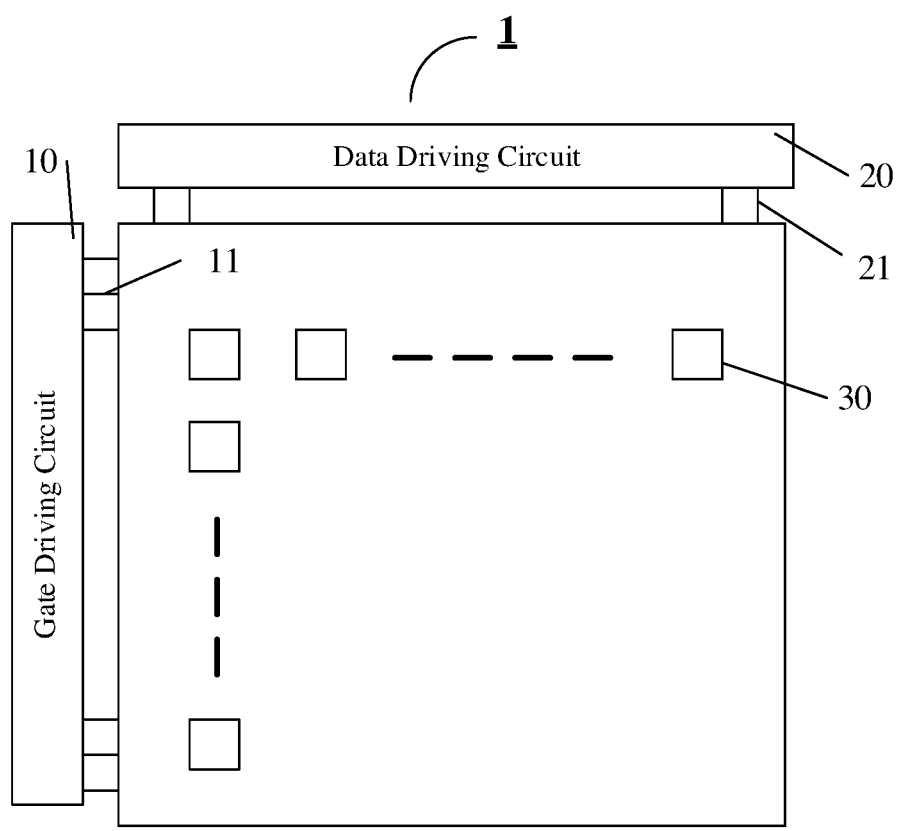
FIG. 7 is a schematic block diagram of a display device provided by an embodiment of the present disclosure.

FIG. 7 is a schematic block diagram of a display device according to an embodiment of the present disclosure. For example, as shown in FIG. 7, a display device 1 includes the gate driving circuit 10 provided by the embodiment of the present disclosure. The display device 1 includes an array composed of a plurality of pixel units 30. For example, the display device 1 may further include a data driving circuit 20. The data driving circuit 20 is used to provide data signals to the pixel array; the gate driving circuit 10 is used to provide gate scanning signals to the pixel array. The data driving circuit 20 is electrically connected to the pixel unit

30 through a data line 21, and the gate driving circuit 10 is electrically connected to the pixel unit 30 through a gate line 11.

It should be noted that the display device 1 in the embodiment may be any product or component with a display function such as a liquid crystal panel, an LCD TV, a display, an OLED panel, an OLED TV, an electronic paper display device, a mobile phone, a tablet computer, a notebook computer, a digital photo frame, a navigator, etc. The display device 1 may further include other conventional components such as a display panel, which is not limited by the embodiments of the present disclosure.

For the specific technical effects of the display device 1 provided by the embodiments of the present disclosure, reference may be made to the corresponding descriptions of the shift register unit 100 and the gate driving circuit 10 in the foregoing embodiments, and the details will not be repeated herein again.

At least one embodiment of the present disclosure also provides a driving method for driving a shift register unit, and the driving method can be used to drive the shift register unit provided by any embodiment of the present disclosure.

Figure 8:
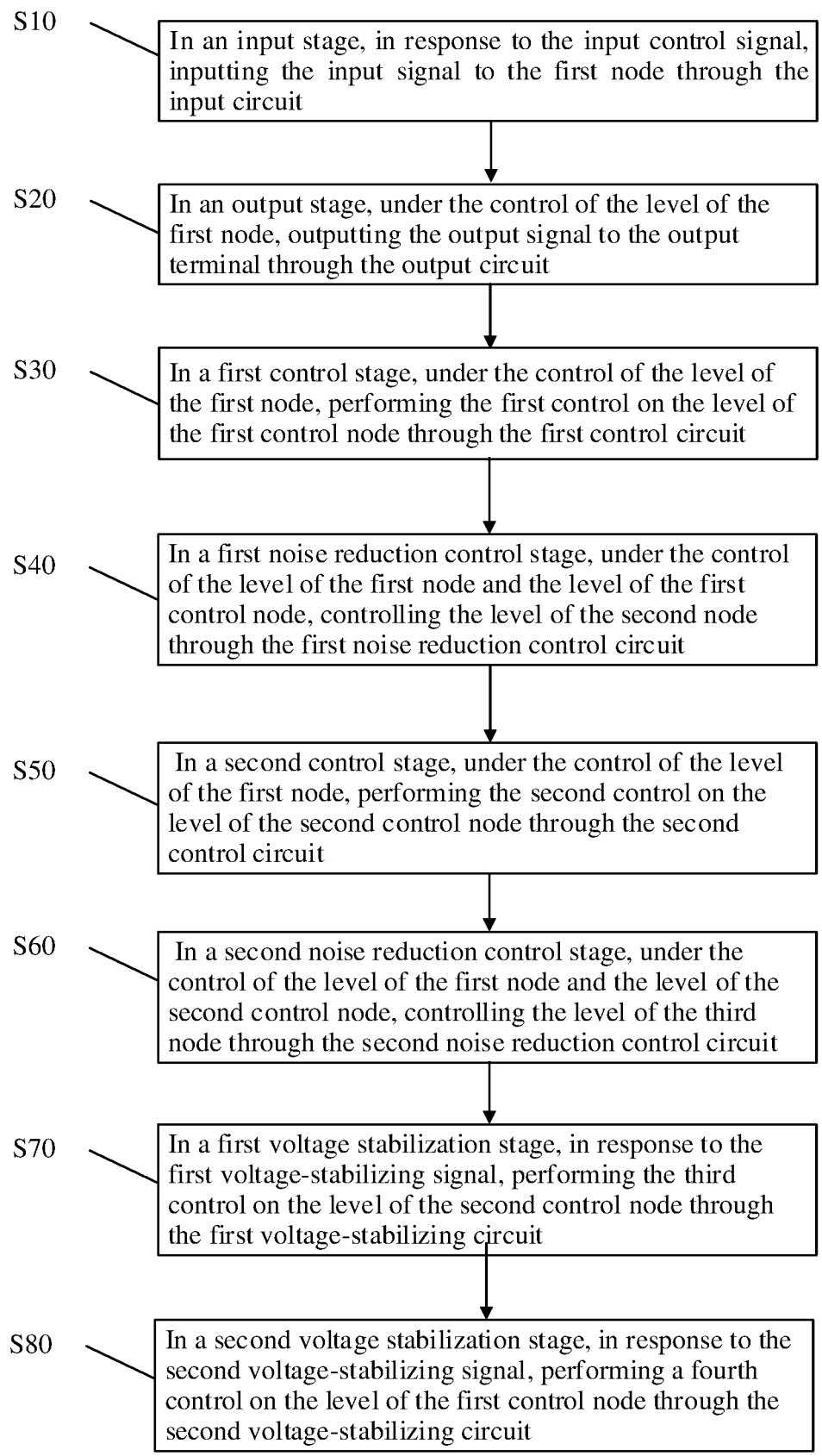
FIG. 8 is a flowchart of a driving method for driving a shift register unit provided by an embodiment of the present disclosure.

FIG. 8 is a flowchart of a driving method for driving a shift register unit according to an embodiment of the present disclosure. For example, as shown in FIG. 8, the driving method for driving the shift register unit may include:

S10: in an input stage, in response to the input control signal, inputting the input signal to the first node through the input circuit;

S20: in an output stage, under the control of the level of the first node, outputting the output signal to the output terminal through the output circuit;

S30: in a first control stage, under the control of the level of the first node, performing the first control on the level of the first control node through the first control circuit;

S40: in a first noise reduction control stage, under the control of the level of the first node and the level of the first control node, controlling the level of the second node through the first noise reduction control circuit;

S50: in a second control stage, under the control of the level of the first node, performing the second control on the level of the second control node through the second control circuit;

S60: in a second noise reduction control stage, under the control of the level of the first node and the level of the second control node, controlling the level of the third node through the second noise reduction control circuit;

S70: in a first voltage stabilization stage, in response to the first voltage-stabilizing signal, performing the third control on the level of the second control node through the first voltage-stabilizing circuit; the second control and the third control causing at least part of the second noise reduction control circuit to be in different bias states.

For example, in the case where the shift register unit includes the second voltage-stabilizing circuit, as shown in FIG. 8, the driving method for driving the shift register unit may further include:

S80: in a second voltage stabilization stage, in response to the second voltage-stabilizing signal, performing a fourth control on the level of the first control node through the second voltage-stabilizing circuit; the first control and the fourth control causing at least part of the first noise reduction control circuit to be in different bias states.

For example, as shown in FIGS. 5A and 5B, the first stage 11/21 may be the input stage, the second stage 12/22 may be the output stage, the third stage 13 may be the first voltage stabilization stage, and the third stage 23 may be the second voltage stabilization stage.

For example, in some embodiments, the second control circuit is configured to be connected to the first voltage terminal to receive the first voltage, and the first voltage-stabilizing circuit is configured to be connected to the first voltage-stabilizing terminal to receive the first voltage-stabilizing voltage. The first voltage-stabilizing voltage includes a first sub-voltage and a second sub-voltage, the first sub-voltage is in the input stage and the output stage, the second sub-voltage is in the first voltage-stabilizing stage, the level of the first sub-voltage is equal to the level of the first voltage, and the level of the second sub-voltage is less than the level of the first voltage. For example, in some examples, the first voltage may be −8V, the first sub-voltage may be −8V, and the second sub-voltage may be −15V.

For example, in S70, in the first voltage stabilization stage, in response to the first voltage-stabilizing signal, performing the third control on the level of the second control node through the first voltage-stabilizing circuit includes: in response to the first voltage-stabilizing signal, the first voltage-stabilizing circuit being turned on to write the second sub-voltage of the first voltage-stabilizing voltage to the second control node to perform the third control on the second control node.

For example, in some embodiments, the first control circuit is configured to be connected to the first voltage terminal to receive the first voltage, and the second voltage-stabilizing circuit is configured to be connected to the second voltage-stabilizing terminal to receive the second voltage-stabilizing voltage. The second voltage-stabilizing voltage includes a third sub-voltage and a fourth sub-voltage, the third sub-voltage is in the input stage and the output stage, the fourth sub-voltage is in the second voltage stabilization stage, the level of the third sub-voltage is equal to the level of the first voltage, and the level of the fourth sub-voltage is less than the level of the first voltage. For example, in some examples, the first voltage may be −8V, the third sub-voltage may be −8V, and the fourth sub-voltage may be −15V.

For example, in some embodiments, the first sub-voltage may be the same as the third sub-voltage, and the second sub-voltage may be the same as the fourth sub-voltage.

For example, in step S80, in the second voltage stabilization stage, in response to the second voltage-stabilizing signal, performing the fourth control on the level of the first control node through the second voltage-stabilizing circuit includes: in response to the second voltage-stabilizing signal, the second voltage-stabilizing circuit being turned on to write the fourth sub-voltage to the first control node to perform the fourth control on the first control node.

For a detailed description and technical effects of the driving method provided by the embodiments of the present disclosure, reference may be made to the corresponding descriptions of the shift register unit 100 and the gate driving circuit 10 in the embodiments of the present disclosure, and the details will not be repeated herein again.

For the present disclosure, the following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

What are described above is only specific embodiments of the present disclosure, but the scope of protection of the present disclosure is not limited thereto, and the scope of protection of the present disclosure should be based on the protection scope of the claims.

What is claimed is:

1. A shift register unit, comprising an input circuit, an output circuit, a first control circuit, a first noise reduction control circuit, a second control circuit, a second noise reduction control circuit, and a first voltage-stabilizing circuit, wherein
   the input circuit is connected to a first node, and is configured to input an input signal to the first node in response to an input control signal;
   the output circuit is connected to the first node and an output terminal, and is configured to output an output signal to the output terminal under control of a level of the first node;
   the first control circuit is connected to the first node and a first control node, and is configured to perform a first control on a level of the first control node under control of the level of the first node;
   the first noise reduction control circuit is connected to the first node, the first control node, and a second node, and is configured to control a level of the second node under control of the level of the first node and the level of the first control node;
   the second control circuit is connected to the first node and a second control node, and is configured to perform a second control on a level of the second control node under the control of the level of the first node;
   the second noise reduction control circuit is connected to the first node, the second control node, and a third node, and is configured to control a level of the third node under the control of the level of the first node and the level of the second control node; and
   the first voltage-stabilizing circuit is connected to the second control node, and is configured to perform a third control on the level of the second control node in response to a first voltage-stabilizing signal, the second control causes at least part of the second noise reduction control circuit to be in a first bias state, the third control causes the at least part of the second noise reduction control circuit to be in a second bias state, and the first bias state is different from the second bias state.

2. The shift register unit according to claim 1, wherein the first voltage-stabilizing circuit is further connected to the second node, and a voltage of the second node is used as the first voltage-stabilizing signal.

3. The shift register unit according to claim 1, further comprising a second voltage-stabilizing circuit, wherein
   the second voltage-stabilizing circuit is connected to the first control node, and is configured to perform a fourth control on the level of the first control node in response to a second voltage-stabilizing signal, the first control causes at least part of the first noise reduction control circuit to be in the first bias state, and the fourth control causes the at least part of the first noise reduction control circuit to be in the second bias state.

4. The shift register unit according to claim 3, wherein the second voltage-stabilizing circuit is further connected to the third node, and a voltage of the third node is used as the second voltage-stabilizing signal.

5. The shift register unit according to claim 3, wherein the second voltage-stabilizing circuit comprises a second transistor, a gate electrode of the second transistor is configured to receive the second voltage-stabilizing signal, a first electrode of the second transistor is connected to the first control node, and a second electrode of the second transistor is connected to a second voltage-stabilizing terminal to receive a second voltage-stabilizing voltage.

6. The shift register unit according to claim 3, wherein the first noise reduction control circuit comprises a third transistor and a fourth transistor, a gate electrode of the third transistor is connected to the first node, a first electrode of the third transistor is connected to the second node, and a second electrode of the third transistor is connected to a first voltage terminal to receive a first voltage; a gate electrode of the fourth transistor is connected to the first control node, a first electrode of the fourth transistor is connected to a second voltage terminal to receive a second voltage, and a second electrode of the fourth transistor is connected to the second node,
   the first control causes the fourth transistor to be in the first bias state, and the fourth control causes the fourth transistor to be in the second bias state.

7. The shift register unit according to claim 1, wherein the first voltage-stabilizing circuit comprises a first transistor, a gate electrode of the first transistor is configured to receive the first voltage-stabilizing signal, a first electrode of the first transistor is connected to the second control node, and a second electrode of the first transistor is connected to a first voltage-stabilizing terminal to receive a first voltage-stabilizing voltage.

8. The shift register unit according to claim 1, wherein the second noise reduction control circuit comprises a fifth transistor and a sixth transistor, a gate electrode of the fifth transistor is connected to the first node, a first electrode of the fifth transistor is connected to the third node, and a second electrode of the fifth transistor is connected to a first voltage terminal to receive a first voltage; a gate electrode of the sixth transistor is connected to the second control node, a first electrode of the sixth transistor is connected to a third voltage terminal to receive a third voltage, and a second electrode of the sixth transistor is connected to the third node,
   the second control causes the sixth transistor to be in the first bias state, and the third control causes the sixth transistor to be in the second bias state.

9. The shift register unit according to claim 1, wherein the first control circuit comprises a seventh transistor and an eighth transistor, and the second control circuit comprises a ninth transistor and a tenth transistor,
   a gate electrode of the seventh transistor is connected to the first node, a first electrode of the seventh transistor is connected to the first control node, and a second electrode of the seventh transistor is connected to a first voltage terminal to receive a first voltage;
   a gate electrode of the eighth transistor is connected to a second voltage terminal to receive a second voltage, a first electrode of the eighth transistor is connected to the second voltage terminal to receive the second voltage, and a second electrode of the eighth transistor is connected to the first control node;
   a gate electrode of the ninth transistor is connected to the first node, a first electrode of the ninth transistor is connected to the second control node, and a second electrode of the ninth transistor is connected to the first voltage terminal to receive the first voltage; and
   a gate electrode of the tenth transistor is connected to a third voltage terminal to receive a third voltage, a first electrode of the tenth transistor is connected to the third voltage terminal to receive the third voltage, and a second electrode of the tenth transistor is connected to the second control node.

10. The shift register unit according to claim 1, wherein the input circuit comprises an eleventh transistor, a gate electrode of the eleventh transistor is configured to receive the input control signal, a first electrode of the eleventh transistor is connected to an input signal terminal to receive the input signal, and a second electrode of the eleventh transistor is connected to the first node.

11. The shift register unit according to claim 1, wherein the output circuit comprises a first sub-output circuit and a second sub-output circuit, the output terminal comprises a shift signal output terminal and a scan signal output terminal, and the output signal comprises a first sub-output signal and a second sub-output signal,
the first sub-output circuit is connected to the first node and the shift signal output terminal, and is configured to output the first sub-output signal to the shift signal output terminal under the control of the level of the first node; and
the second sub-output circuit is connected to the first node and the scan signal output terminal, and is configured to output the second sub-output signal to the scan signal output terminal under the control of the level of the first node.

12. The shift register unit according to claim 11, wherein the first sub-output circuit comprises a twelfth transistor and a storage capacitor, a gate electrode of the twelfth transistor is connected to the first node, a first electrode of the twelfth transistor is connected to a clock signal terminal to receive a clock signal, and a second electrode of the twelfth transistor is connected to the shift signal output terminal to output the clock signal to the shift signal output terminal as the first sub-output signal; a first electrode of the storage capacitor is connected to the gate electrode of the twelfth transistor, and a second electrode of the storage capacitor is connected to the second electrode of the twelfth transistor; and
the second sub-output circuit comprises a thirteenth transistor, a gate electrode of the thirteenth transistor is connected to the first node, a first electrode of the thirteenth transistor is connected to the clock signal terminal to receive the clock signal, and a second electrode of the thirteenth transistor is connected to the scan signal output terminal to output the clock signal to the scan signal output terminal as the second sub-output signal.

13. The shift register unit according to claim 11, further comprising a first reset circuit, a second reset circuit, a node noise reduction circuit, a first output noise reduction circuit, and a second output noise reduction circuit, wherein
the first reset circuit is connected to the first node, and is configured to reset the first node in response to a first reset signal;
the second reset circuit is connected to the first node, and is configured to reset the first node in response to a frame reset signal;
the node noise reduction circuit is connected to the first node, the second node, and the third node, and is configured to perform noise reduction on the first node under control of the level of the second node and the level of the third node;
the first output noise reduction circuit is connected to the shift signal output terminal, the second node, and the third node, and is configured to perform noise reduction on the shift signal output terminal under the control of the level of the second node and the level of the third node; and
the second output noise reduction circuit is connected to the scan signal output terminal, the second node, and the third node, and is configured to perform noise reduction on the scan signal output terminal under the control of the level of the second node and the level of the third node.

14. The shift register unit according to claim 13, wherein the first reset circuit comprises a fourteenth transistor, a gate electrode of the fourteenth transistor is connected to a first reset signal terminal to receive the first reset signal, a first electrode of the fourteenth transistor is connected to the first node, and a second electrode of the fourteenth transistor is connected to a first voltage terminal to receive a first voltage; and
the second reset circuit comprises a fifteenth transistor, a gate electrode of the fifteenth transistor is connected to a frame reset signal terminal to receive the frame reset signal, a first electrode of the fifteenth transistor is connected to the first node, and a second electrode of the fifteenth transistor is connected to the first voltage terminal to receive the first voltage;
the node noise reduction circuit comprises a sixteenth transistor and a seventeenth transistor, a gate electrode of the sixteenth transistor is connected to the second node, a first electrode of the sixteenth transistor is connected to the first node, and a second electrode of the sixteenth transistor is connected to the first voltage terminal to receive the first voltage; a gate electrode of the seventeenth transistor is connected to the third node, a first electrode of the seventeenth transistor is connected to the first node, and a second electrode of the seventeenth transistor is connected to the first voltage terminal to receive the first voltage;
the first output noise reduction circuit comprises an eighteenth transistor and a nineteenth transistor, a gate electrode of the eighteenth transistor is connected to the second node, a first electrode of the eighteenth transistor is connected to the shift signal output terminal, and a second electrode of the eighteenth transistor is connected to the first voltage terminal to receive the first voltage; a gate electrode of the nineteenth transistor is connected to the third node, a first electrode of the nineteenth transistor is connected to the shift signal output terminal, and a second electrode of the nineteenth transistor is connected to the first voltage terminal to receive the first voltage; and
the second output noise reduction circuit comprises a twentieth transistor and a twenty-first transistor, a gate electrode of the twentieth transistor is connected to the second node, a first electrode of the twentieth transistor is connected to the scan signal output terminal, and a second electrode of the twentieth transistor is connected to the first voltage terminal to receive the first voltage; a gate electrode of the twenty-first transistor is connected to the third node, a first electrode of the twenty-first transistor is connected to the scan signal output terminal, and a second electrode of the twenty-first transistor is connected to the first voltage terminal to receive the first voltage.

15. A gate driving circuit comprising a plurality of shift register units, which are cascaded, wherein each of the plurality of shift register units comprises an input circuit, an output circuit, a first control circuit, a first noise reduction control circuit, a second control circuit a second noise reduction control circuit, and a first voltage-stabilizing circuit, wherein the input circuit is connected to a first node, and is configured to input an input signal to the first node in response to an input control signal;

the output circuit is connected to the first node and an output terminal, and is configured to output an output signal to the output terminal under control of a level of the first node;

the first control circuit is connected to the first node and a first control node, and is configured to perform a first control on a level of the first control node under the control of the level of the first node;

the first noise reduction control circuit is connected to the first node, the first control node, and a second node, and is configured to control a level of the second node under the control of the level of the first node and the level of the first control node;

the second control circuit is connected to the first node and a second control node, and is configured to perform a second control on a level of the second control node under the control of the level of the first node;

the second noise reduction control circuit is connected to the first node, the second control node, and a third node, and is configured to control a level of the third node under the control of the level of the first node and the level of the second control node; and the first voltage-stabilizing circuit is connected to the second control node, and is configured to perform a third control on the level of the second control node in response to a first voltage-stabilizing signal, the second control causes at least part of the second noise reduction control circuit to be in a first bias state, the third control causes the at least part of the second noise reduction control circuit to be in a second bias state, and the first bias state is different from the second bias state.

16. A display device comprising the gate driving circuit according to claim 15.

17. A driving method for driving a shift register unit, the shift register unit comprising an input circuit, an output circuit, a first control circuit, a first noise reduction control circuit, a second control circuit, a second noise reduction control circuit, and a first voltage-stabilizing circuit wherein the input circuit is connected to a first node, and is configured to input an input signal to the first node in response to an input control signal;

the output circuit is connected to the first node and an output terminal, and is configured to output an output signal to the output terminal under control of a level of the first node;

the first control circuit is connected to the first node and a first control node and is configured to perform a first control on a level of the first control node under the control of the level of the first node;

the first noise reduction control circuit is connected to the first node, the first control node, and a second node, and is configured to control a level of the second node under the control of the level of the first node and the level of the first control node;

the second control circuit is connected to the first node and a second control node, and is configured to perform a second control on a level of the second control node under the control of the level of the first node;

the second noise reduction control circuit is connected to the first node, the second control node, and a third node, and is configured to control a level of the third node under the control of the level of the first node and the level of the second control node; and the first voltage-stabilizing circuit is connected to the second control node, and is configured to perform a third control on the level of the second control node in response to a first voltage-stabilizing signal, the driving method comprises:

in an input stage, in response to the input control signal, inputting the input signal to the first node through the input circuit;

in an output stage, under the control of the level of the first node, outputting the output signal to the output terminal through the output circuit;

in a first control stage, under the control of the level of the first node, performing the first control on the level of the first control node through the first control circuit;

in a first noise reduction control stage, under control of the level of the first node and the level of the first control node, controlling the level of the second node through the first noise reduction control circuit;

in a second control stage, under the control of the level of the first node, performing the second control on the level of the second control node through the second control circuit;

in a second noise reduction control stage, under control of the level of the first node and the level of the second control node, controlling the level of the third node through the second noise reduction control circuit;

in a first voltage stabilization stage, in response to the first voltage-stabilizing signal, performing the third control on the level of the second control node through the first voltage-stabilizing circuit;

wherein the second control causes at least part of the second noise reduction control circuit to be in a first bias state, the third control causes the at least part of the second noise reduction control circuit to be in a second bias state, and the first bias state is different from the second bias state.

18. The driving method for driving the shift register unit according to claim 17, wherein the second control circuit is configured to be connected to a first voltage terminal to receive a first voltage, the first voltage-stabilizing circuit is configured to be connected to a first voltage-stabilizing terminal to receive a first voltage-stabilizing voltage, the first voltage-stabilizing voltage comprises a first sub-voltage and a second sub-voltage, the first sub-voltage is in the input stage and the output stage, the second sub-voltage is in the first voltage stabilization stage, a level of the first sub-voltage is equal to a level of the first voltage, and a level of the second sub-voltage is less than the level of the first voltage, in the first voltage stabilization stage, in response to the first voltage-stabilizing signal, performing the third control on the level of the second control node through the first voltage-stabilizing circuit comprises:

in response to the first voltage-stabilizing signal, the first voltage-stabilizing circuit being turned on to write the second sub-voltage to the second control node to perform the third control on the second control node.

19. The driving method for driving the shift register unit according to claim 17, wherein in a case where the shift register unit comprises a second voltage-stabilizing circuit, the driving method further comprises:

in a second voltage stabilization stage, in response to a second voltage-stabilizing signal, performing a fourth control on the level of the first control node through the second voltage-stabilizing circuit;

wherein the first control causes at least part of the first noise reduction control circuit to be in the first bias state, and the fourth control causes the at least part of the first noise reduction control circuit to be in the second bias state.

20. The driving method for driving the shift register unit according to claim 19, wherein the first control circuit is configured to be connected to a first voltage terminal to receive a first voltage, the second voltage-stabilizing circuit is configured to be connected to a second voltage-stabilizing terminal to receive a second voltage-stabilizing voltage, the second voltage-stabilizing voltage comprises a third sub-voltage and a fourth sub-voltage, the third sub-voltage is in the input stage and the output stage, the fourth sub-voltage is the second voltage stabilization stage, a level of the third sub-voltage is equal to a level of the first voltage, and a level of the fourth sub-voltage is less than the level of the first voltage, in the second voltage stabilization stage, in response to a second voltage-stabilizing signal, performing a fourth control on the level of the first control node through the second voltage-stabilizing circuit comprises:

in response to the second voltage-stabilizing signal, the second voltage-stabilizing circuit being turned on to write the fourth sub-voltage to the first control node to perform the fourth control on the first control node.

\* \* \* \* \*